United States Patent
Kawazoe et al.

(10) Patent No.: US 7,535,746 B2
(45) Date of Patent: May 19, 2009

(54) NONVOLATILE SEMICONDUCTOR MEMORY DEVICE AND READ METHOD

(75) Inventors: Hidechika Kawazoe, Kitakatsuragi (JP); Yukio Tamai, Tsuchiura (JP); Atsushi Shimaoka, Kashihara (JP); Hidenori Morimoto, Kashihara (JP); Nobuyoshi Awaya, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 204 days.

(21) Appl. No.: 11/191,900

(22) Filed: Jul. 27, 2005

(65) Prior Publication Data
US 2006/0023497 A1 Feb. 2, 2006

(30) Foreign Application Priority Data
Jul. 28, 2004 (JP) .............................. 2004-219810
Jul. 1, 2005 (JP) .............................. 2005-193329

(51) Int. Cl.
*G11C 11/00* (2006.01)
(52) U.S. Cl. ...................... 365/148; 365/158; 365/171; 365/173
(58) Field of Classification Search ................ 365/158, 365/171, 173, 148
See application file for complete search history.

(56) References Cited

U.S. PATENT DOCUMENTS

| | | | | |
|---|---|---|---|---|
| 3,761,896 | A * | 9/1973 | Davidson | ................ 365/148 |
| 5,293,335 | A * | 3/1994 | Pernisz et al. | ............ 365/148 |
| 6,072,716 | A * | 6/2000 | Jacobson et al. | ......... 365/148 |
| 6,204,139 | B1 | 3/2001 | Liu et al. | |
| 6,259,644 | B1 | 7/2001 | Tran et al. | |
| 6,473,332 | B1 | 10/2002 | Ignatiev et al. | |
| 6,529,404 | B2 * | 3/2003 | Hidaka | .................. 365/148 |
| 6,673,691 | B2 * | 1/2004 | Zhuang et al. | ............ 365/148 |
| 6,876,575 | B2 * | 4/2005 | Hidaka | .................. 365/171 |
| 6,888,745 | B2 * | 5/2005 | Ehiro et al. | ............. 365/158 |
| 6,888,773 | B2 * | 5/2005 | Morimoto | ............... 365/148 |
| 6,903,965 | B2 * | 6/2005 | Ishikawa | ................ 365/148 |
| 6,937,505 | B2 * | 8/2005 | Morikawa | ............... 365/158 |

(Continued)

FOREIGN PATENT DOCUMENTS

JP 2002-8369 A 1/2002

(Continued)

OTHER PUBLICATIONS

Liu, S.Q. et al. (May 8, 2000). "Electric-pulse-induced Reversible Resistance Change Effect in Magnetoresistive Films," *Applied Physics Letters* 76(19):2749-2751.

(Continued)

*Primary Examiner*—Trong Phan
(74) *Attorney, Agent, or Firm*—Morrison & Foerster LLP

(57) ABSTRACT

A nonvolatile semiconductor memory device according to the present invention comprises a memory cell selecting circuit for selecting the memory cell from the memory cell array in units of row, column or memory cell; a read voltage application circuit for applying a read voltage to the variable resistor element of the selected memory cells selected by the memory cell selecting circuit; and a read circuit for detecting the amount of the read current flowing in accordance with the resistance value of the variable resistor element with respect to the memory cell to be read of the selected memory cells and reading the information stored in the memory cell to be read; and the read voltage application circuit applies a dummy read voltage having reversed polarity from the read voltage to the variable resistor element of the selected memory cell.

26 Claims, 25 Drawing Sheets

U.S. PATENT DOCUMENTS

| | | | |
|---|---|---|---|
| 6,992,920 B2 * | 1/2006 | Tamai et al. | 365/158 |
| 6,992,922 B2 * | 1/2006 | Rinerson | 365/158 |
| 7,061,790 B2 * | 6/2006 | Morimoto et al. | 365/148 |
| 7,106,618 B2 * | 9/2006 | Morimoto | 365/148 |
| 7,167,390 B2 * | 1/2007 | Ishida et al. | 365/148 |
| 7,233,520 B2 * | 6/2007 | Daley | 365/148 |
| 7,236,388 B2 * | 6/2007 | Hosoi et al. | 365/148 |
| 7,242,606 B2 * | 7/2007 | Hachino et al. | 365/148 |
| 7,245,522 B2 * | 7/2007 | Aoki | 365/158 |
| 7,251,152 B2 * | 7/2007 | Roehr | 365/148 |
| 7,289,351 B1 * | 10/2007 | Chen et al. | 365/148 |

OTHER PUBLICATIONS

European Search Report (Extended) mailed on Dec. 2, 2005 for European Patent Application No. 05254692.6, six pages.

* cited by examiner

NONVOLATILE SEMICONDUCTOR MEMORY DEVICE AND READ METHOD

CROSS REFERENCE TO RELATED APPLICATION

This Nonprovisional application claims priority under 35 U.S.C. §119(a) on Patent Application No. 2004-219810, No. 2005-193329 filed in Japan on Jul. 28, 2004, Jul. 1, 2005 respectively, the entire contents of which are hereby incorporated by reference.

BACKGROUND OF THE INVENTION

Field of the Invention

The present invention relates to a semiconductor storage device including a memory cell array formed by arraying a plurality of memory cells each comprising a variable resistor element for storing information through change in electrical resistance in a row direction and a column direction, more specifically, to a technique of preventing and suppressing degradation of stored data involved in read operation of the memory cell array.

In recent years, as a next-generation Nonvolatile Random Access Memory (NVRAM) capable of being operated at a high speed in place of a flash memory, various device structures such as a Ferroelectric RAM (FeRAM), a Magnetic RAM (MRAM, and an Ovonic Unified Memory (OUM) or the like are proposed and in view of a high performance, a high reliability, a low cost, and a process matching, competition in development of them has been intensified. However, these current memory devices have both merits and demerits respectively and it is difficult to realize the ideal "universal memory" having each merit of a SRAM, a DRAM, and the flash memory.

On the contrary to these existing arts, a method of changing an electric resistance in a reversible fashion by applying a voltage pulse to a perovskite material that is known as a supergiant magnetic resistance effect is disclosed by Shangquing Liu and Alex Ignatiev et al. of University of Houston (refer to the specification of U.S. Pat. No. 6,204,139, Patent Application No.2002-8369, Liu, S. Q. et al., "Electric-pulse-induced reversible Resistance change effect in magnetoresistive films", Applied Physics Letter, Vol., 76, pp. 2749-2751, 2000). This is very epoch-making because the resistance change across several digits appears even at room temperature without applying a magnetic field while using the perovskite material that is known as the supergiant magnetic resistance effect. A Resistive Random Access Memory (RRAM) does not require any magnetic field differently from the MRAM, so that this has an excellent advantage such that the power consumption is very low, minuteness and high integration can be easily realized, and multilevel storage is possible since a dynamic range of the resistance change is very large as compared to the MRAM. The basic structure of the real device is very simple, and it is made in such a manner that a lower electrode material, the perovskite-type metal oxide, and an upper electrode material are deposited in a direction vertical to a substrate. In the meantime, according to the element structure illustrated in the specification of U.S. Pat. No. 6,204,139, the lower electrode material is made of a yttrium barium copper oxide $YBa_2Cu_3O_7$ (YBCO) film deposited on a single crystal substrate of a lantern—aluminum oxide $LaAlO^3$ (LA); the perovskite-type metal oxide is made of a crystalline praseodymium calcium manganic oxide $Pr_{1-x}Ca_xMnO_3$ (PCMO) film; and the upper electrode material is made of an Ag film deposited by sputtering, respectively. It is informed that the operation of this memory element can change the resistance in the reversible fashion by applying 51 volt of the voltage pulse between the upper and lower electrodes in positive and in negative. It means that a new nonvolatile memory device is available by reading a resistance value in this reversible resistance change operation (hereinafter, referred to as "the switching operation" appropriately).

The nonvolatile semiconductor memory device is configured by forming a memory cell array by arraying a plurality of memory cells each comprising a variable resistor element configured with PCMO film and the like for storing information through change in electrical resistance of the variable resistor element in the row direction and the column direction, and arranging a circuit for controlling write, erase, and read of data with respect to each memory cell of the memory cell array on the periphery of the memory cell array.

The configuration of the memory cell comprising the variable resistor element includes a case of configuring each memory cell with a series circuit in which the variable resistor element and a selective transistor are connected in series and a case of configuring each memory cell only with the variable resistor element. The memory cell of the former configuration is referred to as a 1T/1R type memory cell, and the memory cell of the latter configuration is referred to as a 1R type memory cell.

A configuration example of configuring a large-capacity nonvolatile semiconductor memory device by forming the memory cell array with 1T/1R type memory cells will now be described using the diagrams.

FIG. 1 is a view showing a frame format of one configuration example of the memory cell array of 1T/1R type memory cell, and a similar memory cell array configuration is disclosed in Patent application (Patent Application No. 2003-168223) filed by the present applicant. In this memory cell array configuration, the memory cell array 1 has a configuration in which m×n number of memory cells 2 are each arranged at an intersection of m number of bit lines (BL1 to BLm) extending in the column direction and n number of word lines (WL1 to WLn) extending in the row direction. Further, n number of source lines (SL1 to SLn) is arranged parallel to the word line. In each memory cell, the upper electrode of the variable resistor element 3 is connected to the drain electrode of the selective transistor 4, the lower electrode of the variable resistor element 3 is connected to the bit line, the gate electrode of the selective transistor 4 is connected to the word line, and the source electrode of the selective transistor 4 is connected to the source line. It is to be noted that the relationship between the upper electrode and the lower electrode of the variable resistor element 3 may be inverted, or the lower electrode of the variable resistor element 3 may be connected to the drain electrode of the selective transistor 4, and the upper electrode of the variable resistor element 3 may be connected to the bit line.

Therefore, by configuring the memory cell 2 with the series circuit of selective transistor 4 and variable resistor element 3, the selective transistor 4 of the memory cell 2 selected by the potential of the word line is turned on, and further, the write or erase voltage is selectively applied only to the variable resistor element 3 of the memory cell 2 selected by the potential of the bit line thereby allowing the resistance value of the variable resistor element 3 to be changed.

FIG. 2 shows one configuration example of the nonvolatile semiconductor memory device comprising the memory cell array 1 of 1T/1R type memory cell. A specific memory cell in the memory cell array 1 corresponding to an address input, which is input from the address line 8 to a control circuit 10, is selected by a bit line decoder 5, a source line decoder 6, and a word line decoder 7, each operation of write, erase, and read of data is carried out, and thus the data is stored into and read out from the selected memory cell. The input/output of data with an external device (not shown) is performed via the data line 9.

The word line decoder 7 selects the word line of the memory cell array 1 corresponding to the signal input to the address line 8, the bit line decoder 5 selects the bit line of the memory cell array 1 corresponding to the address signal input to the address line 8, and the source line decoder 6 selects the source line of the memory cell array 1 corresponding to the address signal input to the address line 8. The control circuit 10 performs control in each operation of write, erase, and read of the memory cell array 1. The control circuit 10 controls the word line decoder 7, the bit line decoder 5, the source line decoder 6, a voltage switch circuit 12, and read, write, and erase operations of the memory cell array 1 based on the address signal input from the address line 8, a data input (during write) input from the data line 9, and a control input signal input from a control signal line 11. In the example shown in FIG. 2, the control circuit 10 has functions serving as, although not shown, a general address buffer circuit, a data input/output buffer circuit, and a control input buffer circuit.

The voltage switch circuit 12 switches and provides to the memory cell array 1, each voltage of the word line, the bit line, and the source line necessary for read, write, and erase of the memory cell array 1 in accordance with the operation mode. It is to be noted that Vcc is the power supply voltage of the nonvolatile semiconductor memory device, Vss is the ground voltage, Vpp is the write or erase voltage, and V1 is the read voltage. The data is read from the memory cell array 1 by way of the bit line decoder 5 and the read circuit 13. The read circuit 13 determines the state of the data, and transfers the result thereof to the control circuit 10, which then outputs the same to the data line 9.

A configuration example of a large-capacity nonvolatile semiconductor memory device by forming the memory cell array with the 1R type memory cell will now be explained using the diagrams. As shown in FIG. 3, the memory cell 14 is not configured with the series circuit of selective transistor and variable resistor element but is configured only with the variable resistor element 3. The 1R type memory cell 14 is arrayed in a matrix form to configure the memory cell array 15, similar to that disclosed in the Patent article 2 and the like. More specifically, the memory cell array 15 has a configuration in which m×n number of memory cells 14 are each arranged at the intersection of m number of bit lines (BL1 to BLm) extending in the column direction and n number of word lines (WL1 to WLn) extending in the row direction. In each memory cell 14, the upper electrode of the variable resistor element 3 is connected to the word line, and the lower electrode of the variable resistor element 3 is connected to the bit line. It is to be noted that the relationship between the upper electrode and the lower electrode of the variable resistor element 3 may be inverted, or the lower electrode of the variable resistor element 3 may be connected to the word line and the upper electrode of the variable resistor element 3 may be connected to the bit line.

In the memory cell array 1 (refer to FIG. 1 and FIG. 2) configured with the 1T/1R type memory cell 2, when selecting the memory cell to read, write, erase the data, a predetermined bias voltage is applied to the selected word line and the selected bit line thereby turning on only the selective transistor included in the selected memory cell connected to both the selected word line and the selected bit line. The read current thus flows only to the variable resistor element included in the selected memory cell. On the other hand, in the memory cell array 15 configured with the 1R type memory cell 14, when selecting the memory cell to read the data, a similar bias voltage is also applied to the selected memory cells connected to the word line and the bit line in common with the memory cell to be read. The read current thus also flows to the memory cells other than the memory cell to be read. The read current that flows through the selected memory cells selected in row units or column units is detected as the read current of the memory cell to be read by column selection or row selection. In the memory cell array 15 configured with the 1R type memory cell 14, the read current also flows to the memory cells other than the memory cell to be read, but has advantages in that the memory cell structure is simple and that the memory cell area, and further, the memory cell array area are small.

FIG. 3 and FIG. 4 show a conventional example of the procedures for applying voltage to each part during read operation of the data in the memory cell array 15 configured with the 1R type memory cell 14. When reading the data of the selected memory cell, the selected word line connected to the selected memory cell is maintained at ground potential Vss, and during the read period Tr, the read voltage V1 is applied to all the other non-selected word lines and all the bit lines. As voltage difference of read voltage V1 is created between the selected word line and all the bit lines during the read period Tr, the electrical resistance, that is, the read current corresponding to the storage state flows to the variable resistor element of the selected memory cell thereby allowing the data stored in the selected memory cell to be read. In this case, the read current corresponding to the storage state of the selected memory cell connected to the selected word line flows to each bit line, and thus data of the specific selected memory cell is read by selectively reading the read current flowing through a predetermined selected bit line on the bit line side. It is to be noted that the relationship between the bit line and the word line may be interchanged, in which case the read current flowing through each word line is selectively read on the word line side.

FIG. 5 shows one configuration example of the non-volatile semiconductor memory device comprising the memory cell array 15 of 1R type memory cell 14. A specific memory cell in the memory cell array 15 corresponding to the address input, which is input from the address line 18 to the control circuit 20, is selected by the bit line decoder 16 and the word line decoder 17, each operation of write, erase, read of the data is carried out, and thus the data is stored into and read out from the selected memory cell. The input/output of data with the external device (not shown) is performed via the data line 19.

The word line decoder 17 selects the word line of the memory cell array 15 corresponding to the signal input to the address line 18, and the bit line decoder 16 selects the bit line of the memory cell array 15 corresponding to the address signal input to the address line 18. The control circuit 20 performs control in each operation of write, erase, and read of the memory cell array 15. The control circuit 20 controls the word line decoder 17, the bit line decoder 16, the voltage switch circuit 22, and the read, write and erase operations of the memory cell array 15 based on the address signal input from the address line 18, the data input (during write) input from the data line 19, and the control input signal input from the control signal line 21. In the example shown in FIG. 5, the control circuit 20 has functions serving as, although not shown, a general address buffer circuit, a data input/output buffer circuit, and a control input buffer circuit.

The voltage switch circuit 22 switches and provides to the memory cell array 15, each voltage of the word line, the bit line, and the source line necessary for read, write, and erase of the memory cell array 15 in accordance with the operation mode. It is to be noted that Vcc is the power supply voltage of the nonvolatile semiconductor memory device, Vss is the ground voltage, Vpp is the write or erase voltage, and V1 is the read voltage. The data is read from the memory cell array 15 by way of the bit line decoder 16 and the read circuit 23. The read circuit 23 determines the state of the data, and transfers the result thereof to the control circuit 20, which then outputs the same to the data line 19.

The variable resistor element configuring the 1T/1R type memory cell and the 1R type memory cell includes, for example, a phase change memory element that changes the resistance value depending on the crystal of chalcogenide/change of state of amorphous, an MRAM element that uses the resistance change by the tunnel magneto-resistance effect, a memory element of polymer ferroelectric RAM (FRAM) in which the resistance element is formed by electrically conductive polymer, and a RAM element that causes resistance change by electrical pulse application.

When reading the data from the memory cell comprising the variable resistor element, the bias voltage is applied to the variable resistor element to flow the read current, the resistance value of the variable resistor element is determined by the amount of the current and then the data is read. Therefore, irrespective of the configuration of the memory cell, the read operation involves application of a predetermined bias voltage to the variable resistor element.

The inventors of the present invention has found that the resistance value of the variable resistor element changes if the read voltage which absolute value is less than or equal to the write voltage is applied to the variable resistor element as a continuous pulse of the same polarity when using the PCMO film ($Pr_{1-x}Ca_xMnO_3$), one type of perovskite-type metal oxide, as the variable resistor element. As shown in FIG. 6, when the voltage pulse (pulse width of 100 ns) of positive polarity is continued to be applied to the upper electrode of the variable resistor element, the resistance value of the variable resistor element, which initial state is in a high resistance state, lowers as the number of pulse applications is increased (open triangle in FIG.6) Further, when the voltage pulse (pulse width of 100 ns) of negative polarity is continued to be applied, the resistance value increases as the number of pulse applications increases (filled triangle in FIG.6).

The voltage pulse of positive polarity refers to the state in which the ground voltage acting as the reference is provided to the lower electrode, and the positive voltage pulse (e.g., 1V) is applied to the upper electrode. Further, the voltage pulse of negative polarity refers to the state in which the ground voltage acting as the reference is provided to the upper electrode, and the positive voltage pulse (e.g., 1V) is applied to the lower electrode. The measurement conditions of the resistance value shown in FIG. 6 are derived from the current value of when the ground voltage acting as the reference is provided to the lower electrode, and 0.5V is applied to the upper electrode. The axis of abscissa of FIG. 6 shows the logarithmic representation of the relative application number of the voltage pulse.

Open circles in FIG. 7 shows the result of research on resistance change of when the positive voltage pulse is applied to the upper electrode of the variable resistor element, which initial state is in the low resistance state. Filled circles in FIG. 7 show resistance change when the negative voltage pulse is applied and open squares show an example of resistance change when the voltage pulses of positive polarity and negative polarity are alternately applied. It is to be noted that the measurement conditions of the resistance value shown in FIG. 7 are derived from the current value of when the ground voltage acting as the reference is provided to the lower electrode, and 0.5V is applied to the upper electrode. The axis of abscissa of FIG. 7 is the logarithmic representation of the relative application number of the voltage pulse. It is apparent from FIG. 7 that the resistance change is small compared to when the initial state is in the high resistance state. In particular, the voltage applied to the variable resistor element during read is usually desired to be about 1V, but the resistance change is small at 1V or −1V.

Therefore, from the above experiment results, a read disturb phenomenon in which the data stored in the memory cell, that is, the resistance value changes in accordance with the number of voltage pulse applied with the read operation is recognized. In particular, when the read operation is performed by applying the voltage pulse of positive polarity to the variable resistor element, which resistance state during read is high resistance state, the resistance value of the relevant variable resistor element lowers, the resistance difference between the high resistance state and the low resistance state becomes small, and the read margin lowers. Further, when the read operation is repeated on the same memory cell, in the worst case, the stored data may be completely lost and the read operation may become impossible to be performed any further.

Moreover, in the memory cell array formed with the 1R type memory cell, the read voltage is applied also to the memory cells other than the selected memory to be read having the word line or the bit line in common with the memory cell to be read, and thus the read disturb phenomenon is more significantly recognized.

SUMMARY OF THE INVENTION

The present invention, in view of the above problem, aims to provide a nonvolatile semiconductor memory device having a large read margin that prevents reading failure caused by change in the resistance value of a variable resistor element included in a memory cell due to voltage pulse application on the memory cell when reading the memory cell.

A nonvolatile semiconductor memory device according to the present invention comprises a memory cell array formed by arraying a plurality of memory cells each including a variable resistor element for storing information through change in electrical resistance in a row direction and a column direction, and further comprises a memory cell selecting circuit for selecting the memory cell from the memory cell array in units of row, column or memory cell; a read voltage application circuit for applying a read voltage to the variable resistor element of the selected memory cells selected by the memory cell selecting circuit; and a read circuit for detecting the amount of the read current flowing in accordance with the resistance value of the variable resistor element with respect to the memory cell to be read of the selected memory cells and reading the information stored in the memory cell to be read; the read voltage application circuit applying a dummy read voltage having reversed polarity from the read voltage to the variable resistor element of the selected memory cell.

In the nonvolatile semiconductor memory device according to the present invention, the read voltage application circuit applies both the read voltage and the dummy read voltage to the same selected memory cell within one selecting period until the memory cell selecting circuit switches the selection of the selected memory cell to a different memory cell.

In the present invention, when the read voltage or the dummy read voltage is applied to the variable resistor element, the resistance value of the variable resistor element is infinitely in the high resistance state, that is, unless an insulating body, the current flows through the variable resistor element in the relevant voltage application period and thus the voltage application state is also considered as a current application state.

According to the nonvolatile semiconductor memory device mentioned above, the read voltage application circuit is capable of performing both the application of the read voltage and the application of the dummy read voltage having reversed polarity to the selected memory cell, and thus by applying the dummy read voltage having reversed polarity to the variable resistor element of the selected memory cell applied with the read voltage and which resistance value may increase or decrease, the resistance is changed in a direction of canceling out the resistance change by the read voltage application, and thus even if the number of times of read voltage application is increased, the accumulative resistance change from the initial resistance state is suppressed, the lowering of the read margin is suppressed, and further, the number of read until the stored data is lost or the read disabled state is reached is greatly improved.

For instance, according to the experimental result of measuring the resistance change involved in the voltage pulse application to the variable resistor element as shown in FIG. 6, when comparing a ease of continuously applying only the voltage pulse (voltage amplitude 2V, pulse width 100 ns) of positive polarity (open triangle in FIG. 6) and a case of alternately applying the voltage pulse (voltage amplitude 2V, pulse width 100 ns) of positive polarity and negative polarity (filled triangle in FIG. 6) with the initial state in the high resistance state, the resistance change of when applying the voltage pulse of positive polarity and negative polarity (former corresponds to read voltage application, latter corresponds to dummy read voltage application) is apparently greatly suppressed, thereby supporting the above effect.

In particular, by applying both the read voltage and the dummy read voltage one after the other within one selecting period, when the read voltage is applied to a specific memory cell, the dummy read voltage having reversed polarity must be applied, and thus the resistance change (read disturb phenomenon) involved in the read operation is reliably suppressed.

Further, in the nonvolatile semiconductor memory device according to the present invention, the application period of the dummy read voltage on the variable resistor element of the selected memory cell is shorter than the application period of the read voltage and the current flowing through the variable resistor element of the selected memory cell during the application of the dummy read voltage is larger than the current flowing during the application of the read voltage.

With the relevant configuration, by adjusting the application voltage of the dummy read voltage to be large and the application period to be short, the resistance change of the variable resistor element involved in read operation is similarly suppressed by shortening the total application period of the read voltage and the dummy read voltage, and the read cycle time is suppressed from becoming long due to application of the dummy read voltage.

The advantages of the present invention having the above aspects is sufficiently exhibited in either a case of when the memory cell is a 1R type memory cell, which memory cell array is configured including a plurality of row selecting lines extending in the row direction and a plurality of column selecting lines extending in the column direction and each memory cell of the same row has one end side of the variable resistor element connected to the same row selecting line, and each memory cell of the same column has the other end side of the variable resistor element connected to the same row selecting line; or a case of when the memory cell is a 1T/1R type memory cell, which memory cell array is configured including a plurality of row selecting lines extending in the row direction and a plurality of column selecting lines extending in the column direction and each memory cell of the same row has a gate of the selective transistor connected to the same row selecting line, each memory cell of the same column has one end side of a series circuit connected to the same column selecting line, and each memory cell has the other end of the series circuit connected to the source line.

A read method according to the present invention in the nonvolatile semiconductor memory device is a method of reading information from a memory cell comprising a variable resistor element for storing information through change in electrical resistance, and the method comprises the steps of a first process of applying a predetermined read voltage to the variable resistor element of the memory cell to be read and determining the amount of the current flowing to the variable resistor element; and a second process of applying a dummy read voltage having reversed polarity from the read voltage to the variable resistor element of the memory cell applied with the read voltage in the first process. Further, the read method according to the present invention is characterized in that the first process and the second process are performed temporally one after the other during a period the memory cell applied with the read voltage in the first process is selected.

According to the read method having the above features, by applying the dummy read voltage having reversed polarity in the second process to the variable resistor element of the memory cell that is applied with the read voltage in the first process and which resistance value may increase or decrease, the resistance is changed in a direction of canceling out the resistance change by the read voltage application. Consequently, even if the number of times the read voltage is applied in the first process is increased, the accumulative resistance change from the initial resistance state is suppressed, the lowering of the read margin is suppressed, and further, the number of read times until the stored data is lost or the read disabled state is reached is greatly improved.

DETAILED DESCRIPTION OF THE PREFERRED EMBODIMENTS

The preferred embodiments of the nonvolatile semiconductor memory device (hereinafter referred to as "present invention device") according to the present invention will now be described based on the drawings.

In the present embodiment, the memory cell configuring the memory cell array of the nonvolatile semiconductor memory device is formed comprising the variable resistor element for storing information through change in electrical resistance. An explanation is given assuming a RRAM element of three layer structure in which the Pt electrode is arranged above and below the PCMO film as one example of the variable resistor element. It is to be noted that with regards to the variable resistor element, as long as the resistance changes of the element occurs by voltage application (or current application), the present invention may be applied with any variable resistor element. It is also to be noted that with regards to the variable resistor element, as long as the resistance change of the element occurs by electrical pulse application (or current application), the present invention may be applied with any variable resistor element. The present invention is applicable as long as the material of the variable resistor element is such in which the resistance change is caused by electrical pulse application, and may be any metal oxide other than the PCMO film. The present invention is applicable as long as the material of the variable resistor element is a transition metal oxide and the resistance change is caused by electrical pulse application.

The inventors of the present invention has found that when the variable resistor element is formed with the PCMO film ($Pr_{1-x}Ca_xMnO_3$), one type of perovskite-type metal oxide, and the Pt electrodes arranged on the upper part and the lower part of the PCMO film, and the voltage pulse of the same polarity that flows the current in a constant direction is continuously applied to the variable resistor element, the resistance of the variable resistor element changes as the number of pulse application increases. It is to be noted that the PCMO film of the variable resistor element is grown using the sputtering method at 500° C.

Figure 6:
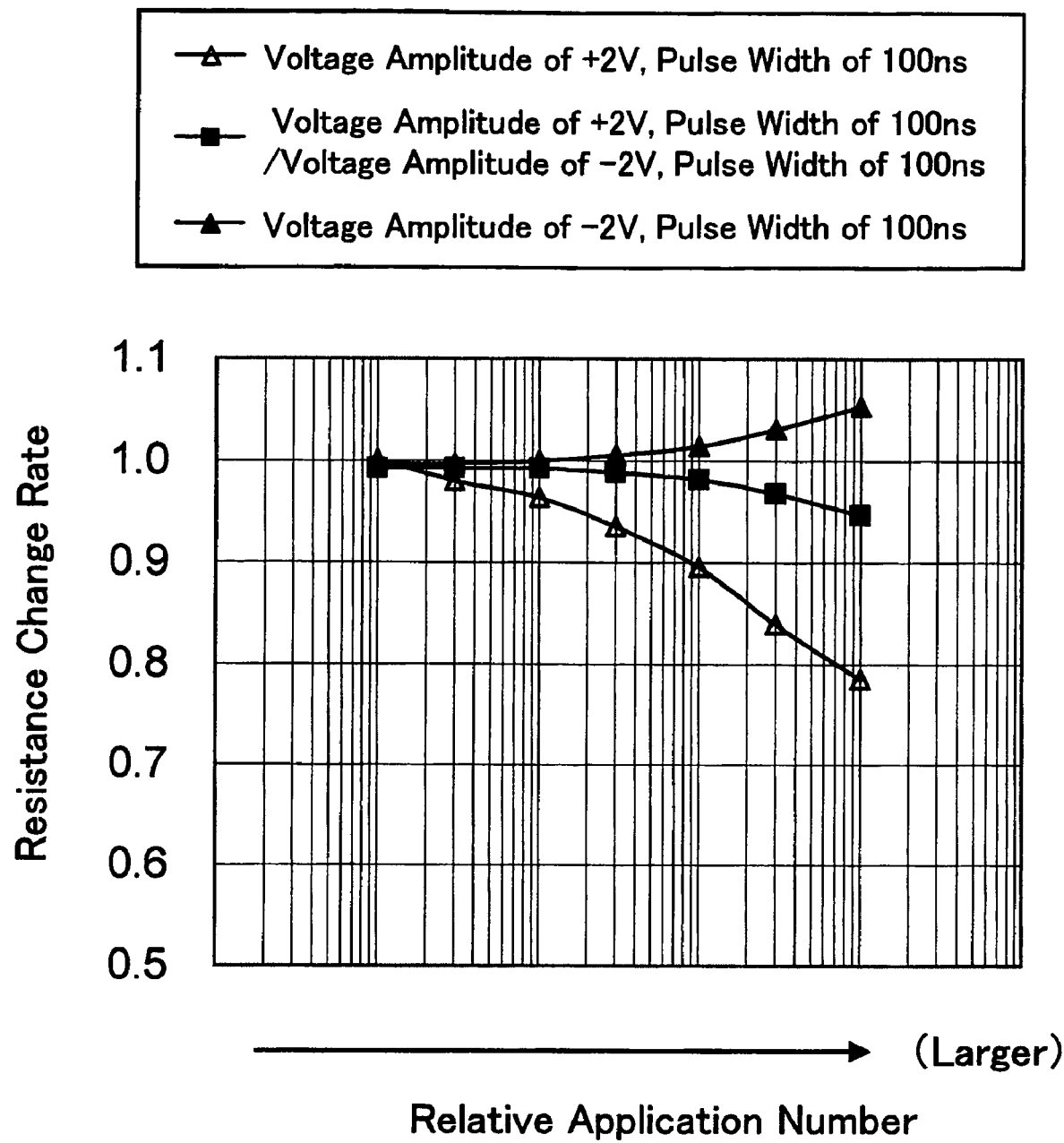
FIG. 6 is a characteristic diagram showing the relationship of voltage pulse application and resistance change with respect to the variable resistor element which initial state is in a high resistance state.
Figure 7:
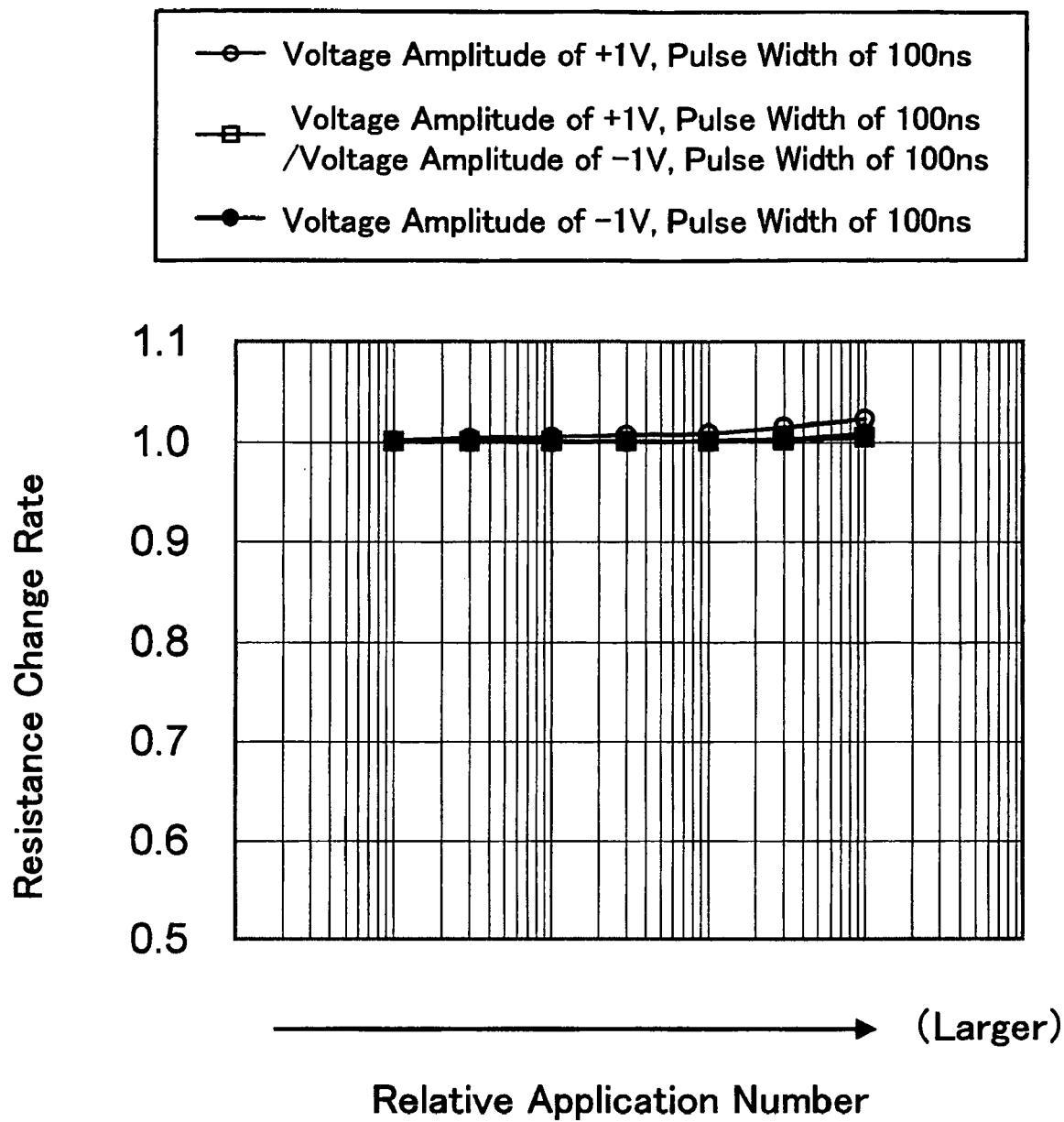
FIG. 7 is a characteristic diagram showing the relation ship of voltage pulse application and resistance change with respect to the variable resistor element which initial state is in a low resistance state.

As shown in FIG. 6, if the pulse (pulse width 100 ns) of positive polarity is continued to be applied to the upper electrode of the variable resistor element, the resistance value of the variable resistor element, which initial state, that is, the pulse non-application state is in the high resistance value, lowers in accordance with the increase in the number of pulse applications (open triangle in FIG. 6). The high resistance state of the initial state is created by applying the write voltage pulse of write voltage Vpp=4V and pulse width 3 μs to the lower electrode.

When the pulse (pulse width 100 ns) of negative polarity, which is the same polarity as the write voltage pulse, is continued to be applied, the resistance value increases in accordance with the increase in the number of pulse applications (filled triangle in FIG. 6). Further, it is recognized that the greater the voltage amplitude of the voltage pulse to be applied, that is, the larger the current flowing through the variable resistor element, the larger the extent of the resistance change, and further, the change in resistance in the direction of increase or the change in resistance in the direction of decrease depends on the direction of current flow, that is, the polarity of the voltage pulse to be applied.

The inventors of the present invention focused on the fact that the direction of the resistance change of the variable resistor element depends on the direction of the current flowing through the variable resistor element by the voltage pulse application, and proposed a method of canceling out the resistance change by applying the voltage pulse that flows the current in the direction different from the direction of read in the read operation, and attempted to alternately and continuously apply the voltage pulses that flow the current in different directions to the variable resistor element. Filled squares in FIG. 6 is a typical example showing the state of resistance change of a case of applying the continuous voltage pulse to the variable resistor element, which initial state is in the high resistance state, and in combination therewith, applying the pulse of reversed polarity that flow the current in the opposite direction. Compared to when continuously applying the voltage pulse of the same polarity (open triangle: application of the positive voltage pulse; filled triangle: application of the negative voltage pulse), the resistance change is found to be small when combining the voltage pulses of different polarity and alternately applying such voltage pulses (filled square). Thus, when reading the stored data of the memory cell including the variable resistor element, by forcibly flowing the current that flows in the direction opposite from the direction of the current that flows during read, the resistance change caused by voltage pulse application during read is suppressed and minimized, and thus the read number is increased.

In order to reduce the change in resistance of the variable resistor element of the memory cell by applying the read voltage pulse to the variable resistor element of the memory cell, a method of applying a dummy read voltage pulse having reversed polarity that flow the current in the opposite direction before applying the read voltage pulse is proposed.

As the resistance change of the variable resistor element becomes larger as the amplitude of the voltage pulse becomes larger, the resistance change is minimized by adjusting the dummy read voltage pulse to be applied before the application of the read voltage pulse, and the read number, or the number of times the memory cell is properly read until read becomes disabled due to lowering of read margin is increased.

Further, as the resistance change becomes small when the pulse width of the dummy read voltage pulse to be applied is short, if the dummy read voltage pulse of large amplitude is used, the resistance change by the read voltage pulse is canceled with the application of the dummy read voltage pulse over a short period of time, thereby shortening the effective read time, and is thus preferable. It is to be noted that even when applying the dummy read voltage pulse of large amplitude, the voltage pulse may be applied with the pulse width of the same extent as the read pulse instead of the pulse width of a short period of time.

Another method of reducing the change in resistance of the variable resistor element of the memory cell by applying the read voltage pulse to the variable resistor element of the memory cell includes a method of applying the dummy read voltage pulse having reversed polarity that flow the current in the opposite direction after applying the read voltage.

As the resistance change of the variable resistor element becomes larger as the amplitude of the voltage pulse becomes larger, the resistance change is minimized by adjusting the dummy read voltage pulse to be applied after the application of the read voltage pulse, and the read number, or the number of times the memory cell is properly read until read becomes disabled due to lowering of read margin is increased.

Further, as the resistance change becomes small when the pulse width of the dummy read voltage pulse to be applied is short, if the dummy read voltage pulse of large amplitude is used, the resistance change by the read voltage pulse is canceled with the application of the dummy read voltage pulse over a short period of time, thereby shortening the effective read time, and is thus preferable.

The present invention device in which the resistance change of the variable resistor element involved in the read operation is suppressed will now be explained based on the new knowledge of the above variable resistor element. First, the present invention device of when the memory cell is a 1R type memory cell configured only with the variable resistor element will be explained.

First Embodiment

Figure 5:
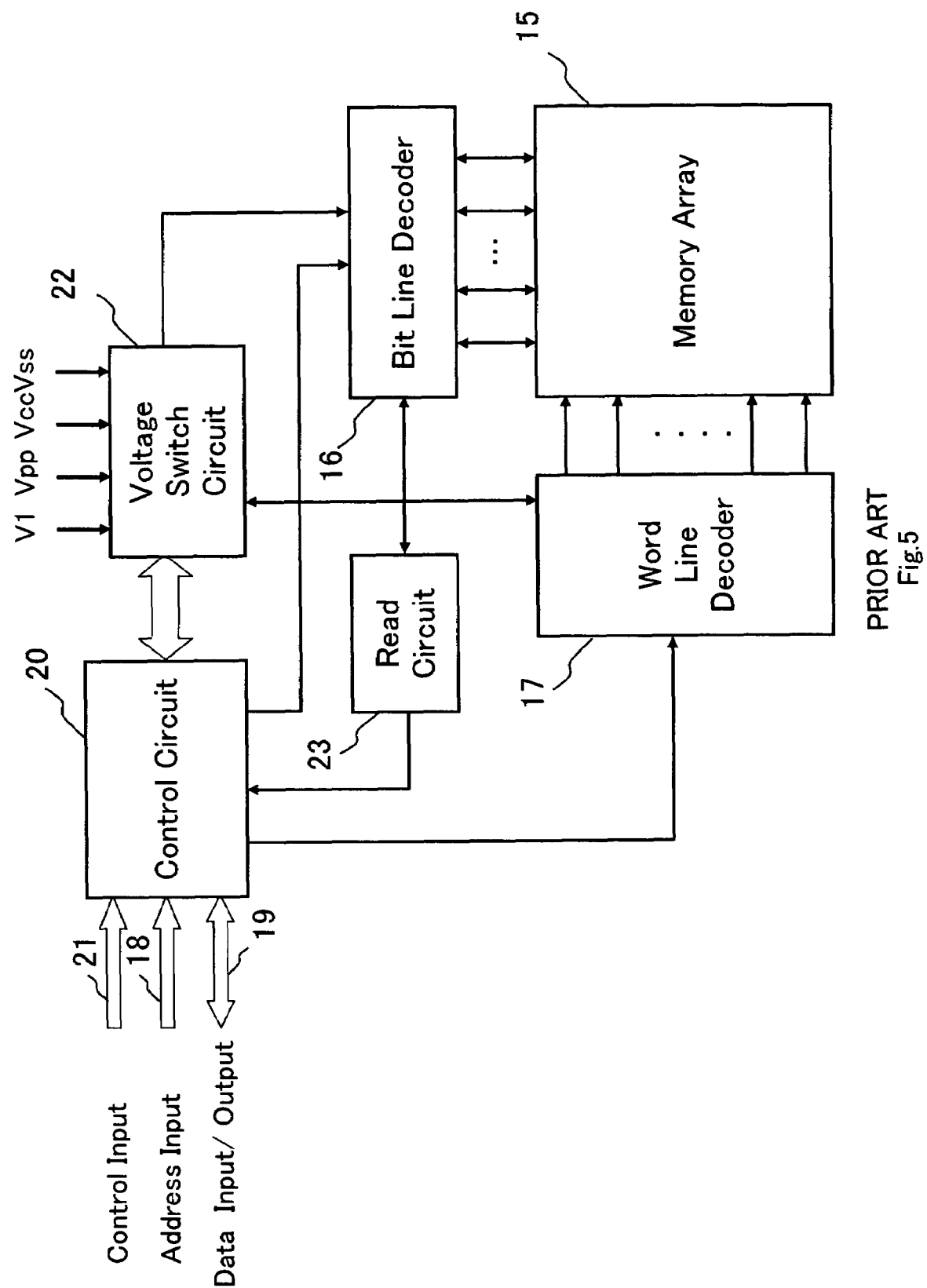
FIG. 5 is a block diagram showing one configuration example of a conventional nonvolatile semiconductor memory device including the memory cell array of 1R type memory cell.
Figure 8:
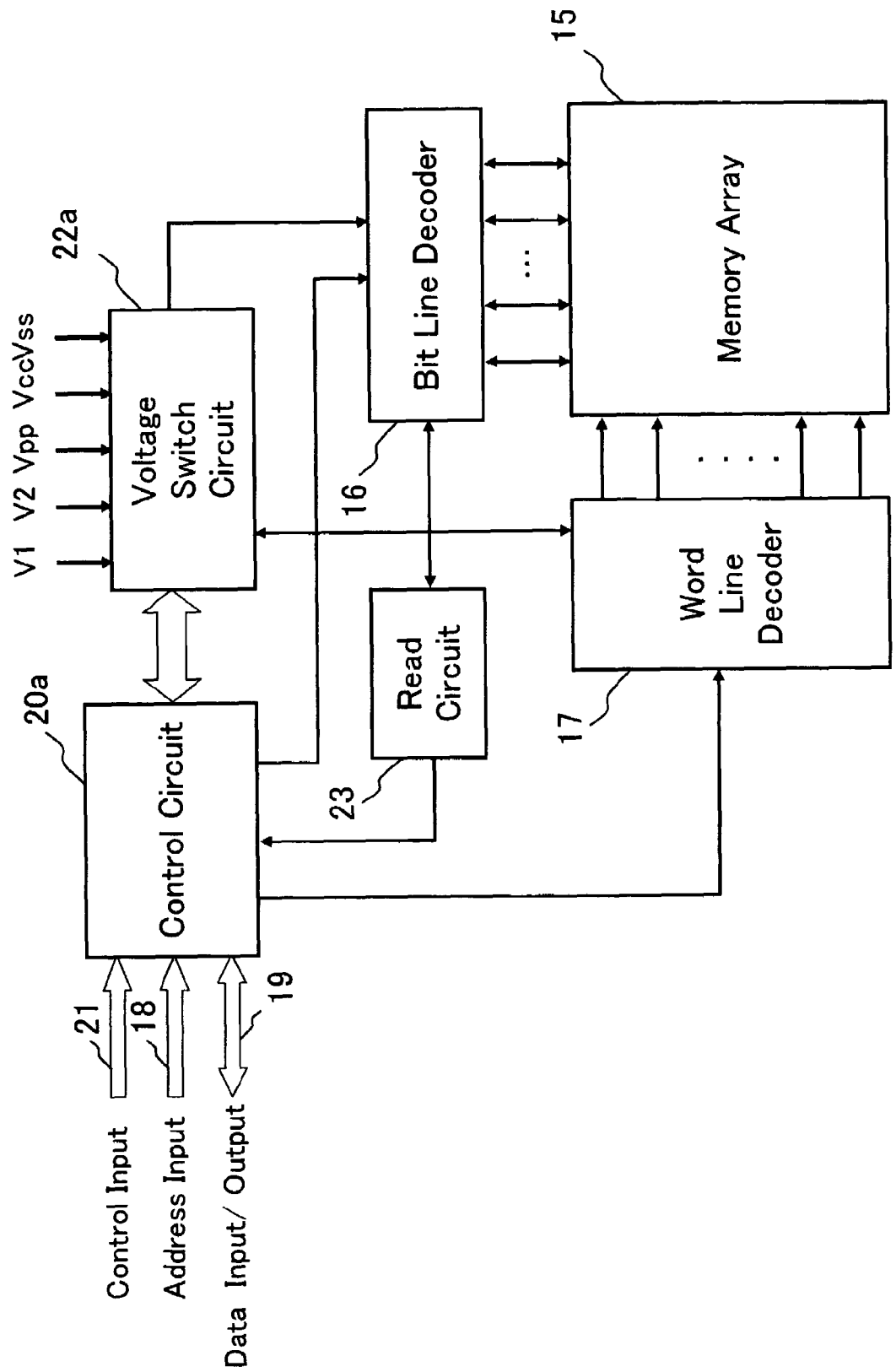
FIG. 8 is a block diagram showing one configuration example of a nonvolatile semiconductor memory device according to the present invention including the memory cell array of 1R type memory cell.

FIG. 8 shows one configuration example of the present invention device. In FIG. 8, the same reference characters are denoted for the parts in common with the conventional nonvolatile semiconductor memory device. As shown in FIG. 8, the present invention device is configured by including the bit line decoder 16, the word line decoder 17, the voltage switch circuit 22a, the read circuit 23, and the control circuit 20a on the periphery of the memory cell array 15 in which the 1R type memory cell (not shown) is arrayed in a matrix form. The configuration is basically the same as the configuration of the conventional nonvolatile semiconductor memory device including the memory cell array of 1R type memory cell shown in FIG. 5. The difference from the conventional nonvolatile semiconductor memory device of FIG. 5 lies in the voltage applied from the voltage switch circuit 22a to the memory cell array 15 and the timing operation thereof, and the operation of the control circuit 20a for controlling the operation of the voltage switch circuit 22a.

Figure 3:
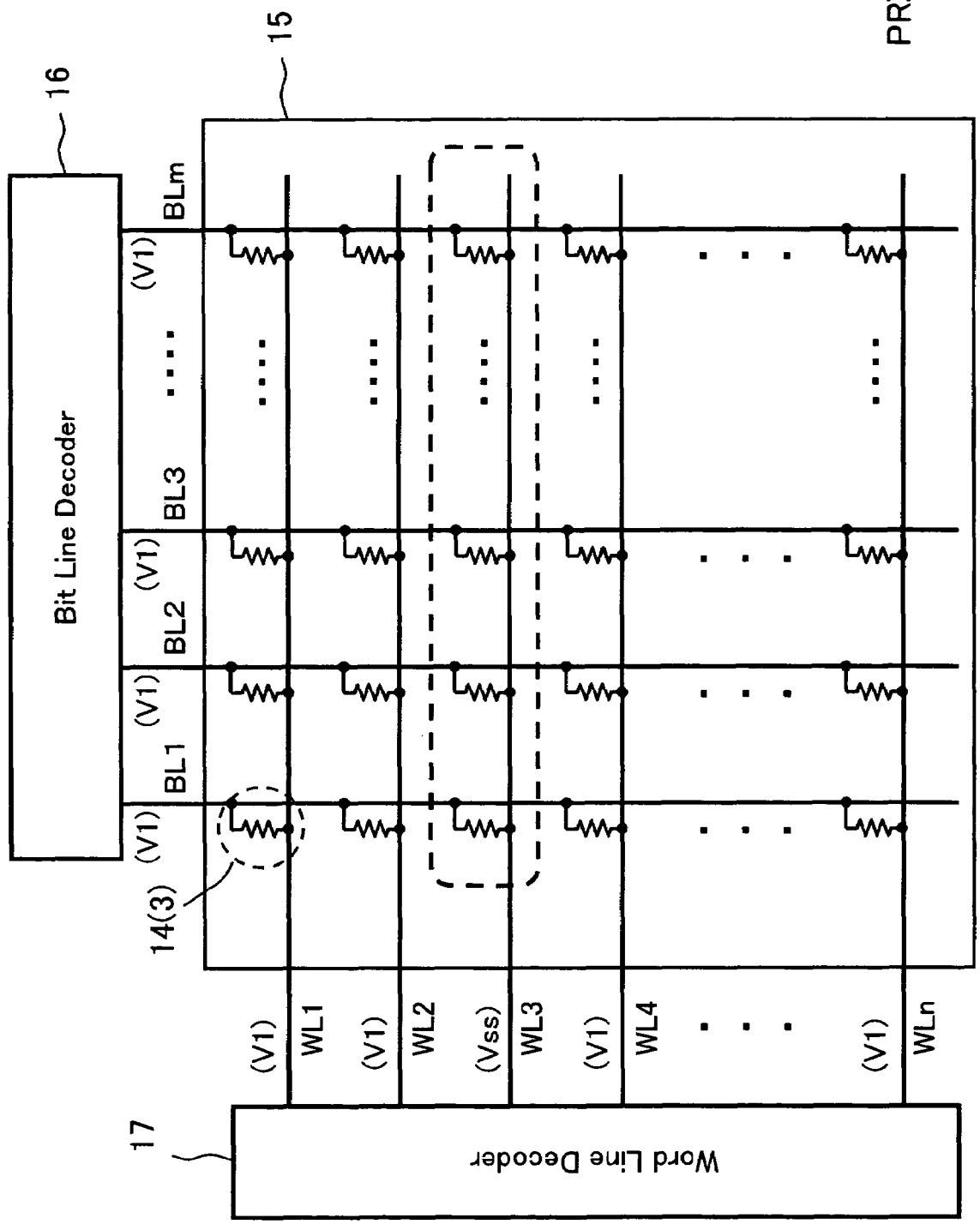
FIG. 3 is a circuit diagram showing a frame format of one configuration example of a memory cell array of 1R type memory cell configured only with the variable resistor element.
Figure 4:
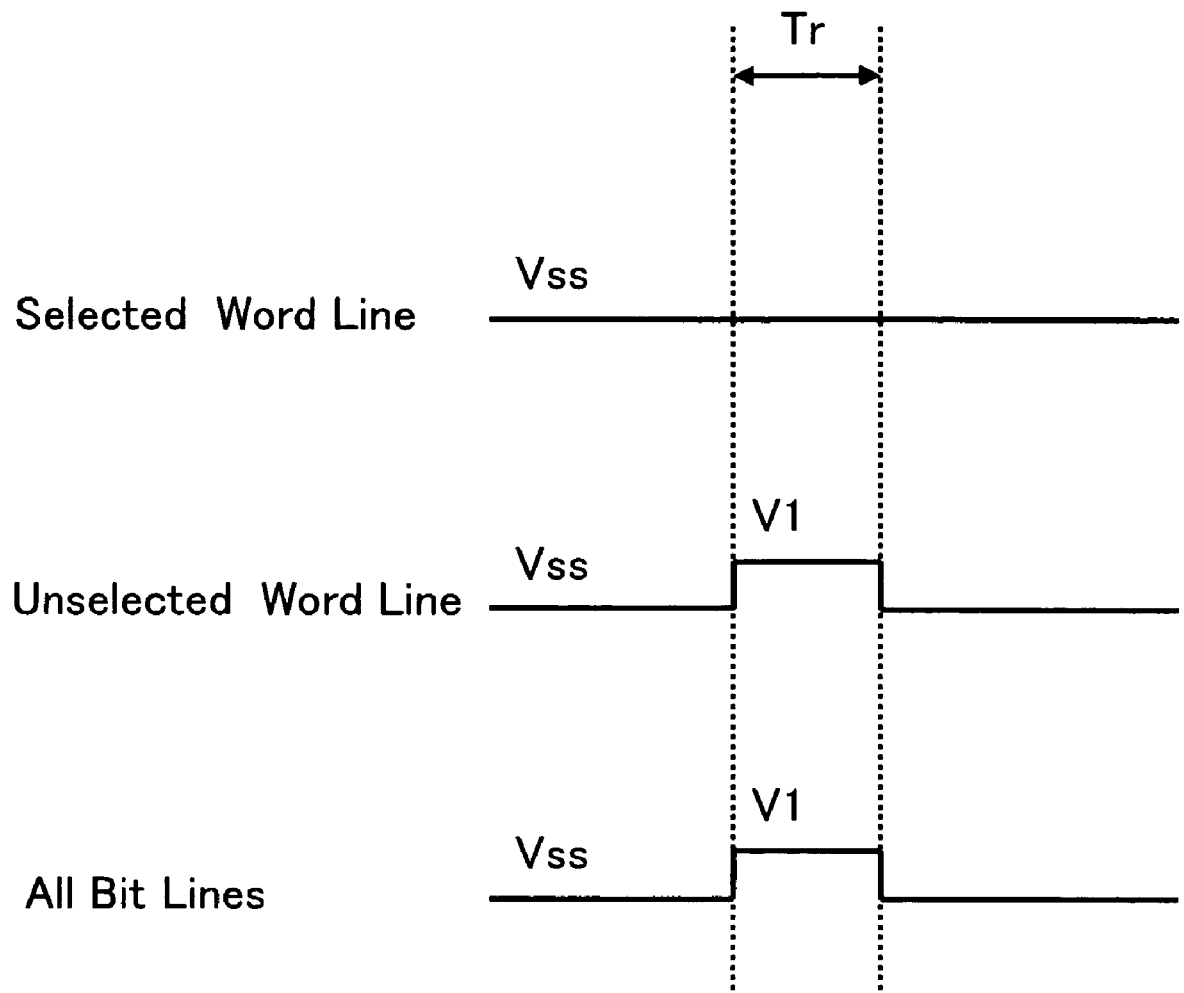
FIG. 4 is a timing diagram showing a conventional example of a procedure for applying voltage to each word line and each bit line in read operation of data in the memory cell array configured with the 1R type memory cell.

The configuration of the memory cell array 15 is also the same as the configuration of the memory cell array 15 of the conventional nonvolatile semiconductor memory device shown in FIG. 3. More specifically, the memory cell array 15 is configured so that m×n number of memory cells 2 are each arranged at the intersection of m number of bit lines (equivalent to column selecting line) (BL1 to BLm) extending in the column direction and n number of word lines (equivalent to row selecting line) (WL1 to WLn) extending in the row direction. In each memory cell 14, the upper electrode of the variable resistor element 3 is connected to the word line, and the lower electrode of the variable resistor element 3 is connected to the bit line. It is to be noted that the relationship between the upper electrode and the lower electrode of the variable resistor element 3 may be inverted, or the lower electrode of the variable resistor element 3 may be connected to the word line and the upper electrode of the variable resistor element may be connected to the bit line.

The bit line decoder 16 and the word line decoder 17 select the memory cell to be read from the memory cell array 15 corresponding to the address input that is input from the address line 18 to the control circuit 20a. The word line decoder 17 selects the word line of the memory cell array 15 corresponding to the signal input to the address line 18, and the bit line decoder 16 selects the bit line of the memory cell array 15 corresponding to the address signal input to the address line 18. In the present embodiment, the word line decoder 17 functions as a memory cell selecting circuit for selecting the memory cell in row units from the memory cell array 15. The control circuit 20a performs control in each operation of write, erase, and read of the memory cell array 15. The control circuit 20a controls the word line decoder 17, the bit line decoder 16, the voltage switch circuit 22, and read, write and erase operations of the memory cell array 15 based on the address signal input from the address line 18, the data input (during write) input from the data line 19, and the control input signal input from the control signal line 21. In the example shown in FIG. 5, the control circuit 20a has functions serving as, although not shown, a general address buffer circuit, a data input/output buffer circuit, and a control input buffer circuit.

The voltage switch circuit 22a switches and provides to the memory cell array 15, each voltage of the word line and the bit line necessary for read, write and erase of the memory cell array 15 in accordance with the operation mode. In particular, in the read mode, the voltage switch circuit 22a functions as a read voltage application circuit for applying a predetermined read voltage to the bit line and the word line connected to one row of selected memory cells selected by the word line decoder 17. In the present embodiment, a predetermined read voltage is applied to the memory cells connected to the one selected word line selected by the word line decoder 17, which memory cell acts as the selected memory cell. In the figure, Vcc is the power supply voltage of the present invention device, Vss is the ground voltage, Vpp is the write or erase voltage, and V1 and V2 are voltages used in generating the read voltage and the dummy read voltage.

The read circuit 23 converts, of the read currents flowing through the bit lines connected to the selected memory cell, the read current flowing through the selected bit line selected by the bit line decoder 16 to voltage, determines the state of the stored data of the memory cell to be read connected to the selected bit line out of one row of selected memory cells, and transfers the result to the control circuit 20a, which then outputs to the data line 19.

Examples of procedures for applying the voltage pulse to each bit line and each word line of the memory cell array 15 from the voltage switch circuit 22a in the read operation will now be explained.

EXAMPLE 1

A first example of when applying the read voltage to the selected memory cell for read operation of the data, and subsequently applying the dummy read voltage for suppressing the resistance change of the selected memory cell will now be explained with reference to FIG. 9 and FIG. 10.

Figure 9:
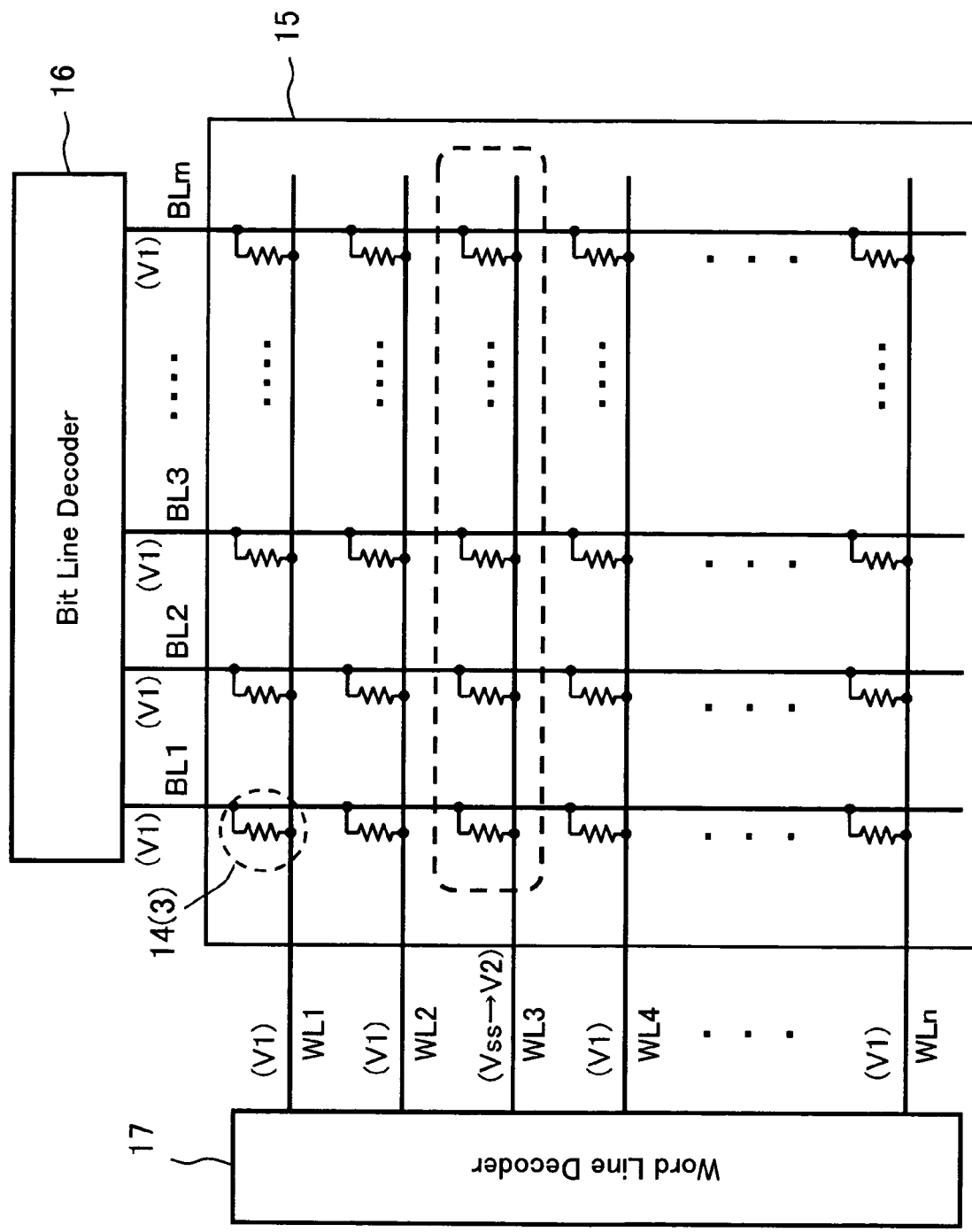
FIG. 9 is a circuit diagram showing a frame format of one configuration example of a memory cell array of 1R type memory cell and one example of voltage application procedure in the nonvolatile semiconductor memory device according to the present invention.
Figure 10:
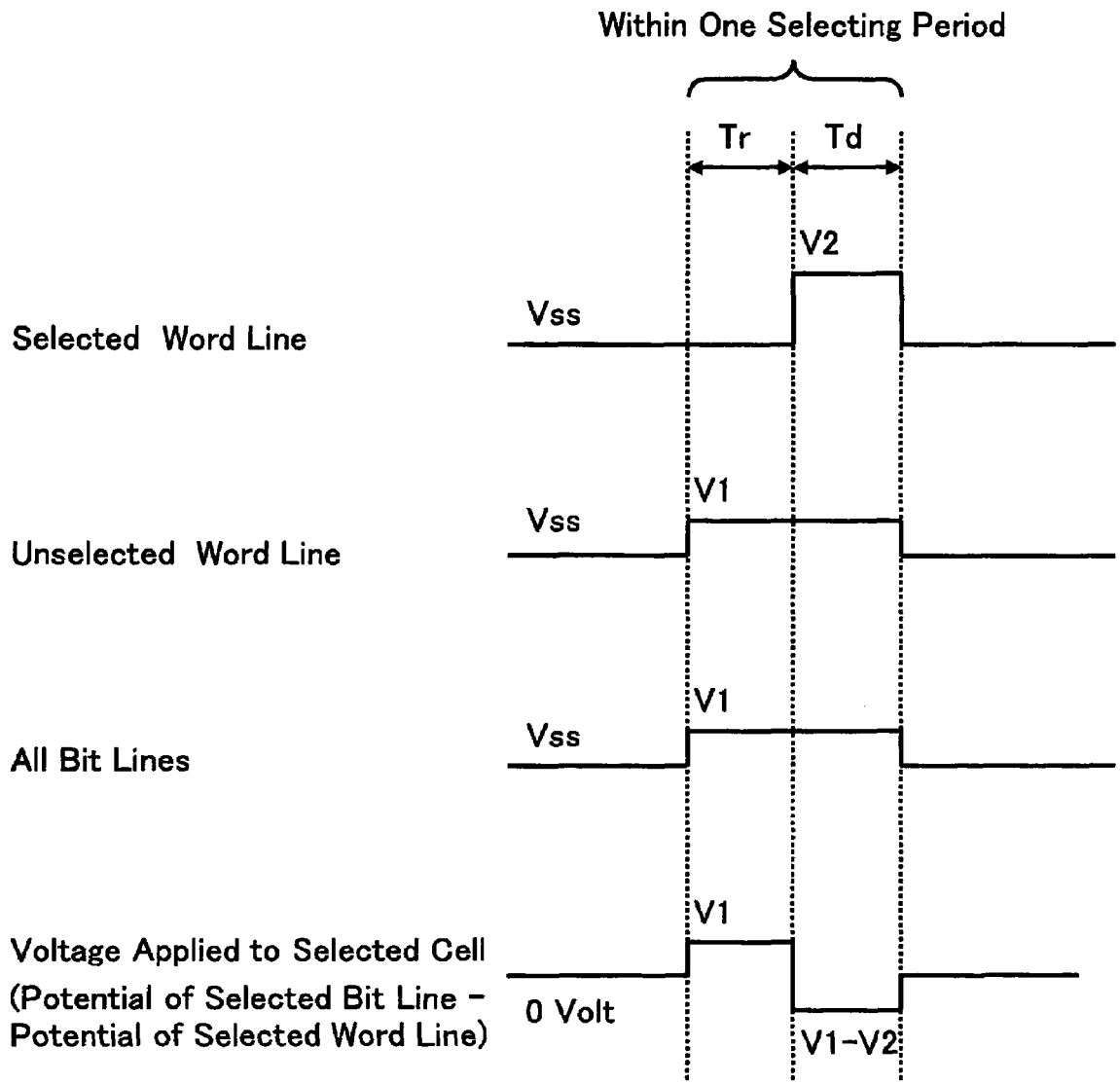
FIG. 10 is a timing diagram showing one example of a procedure for applying a voltage to each word line and each bit line in read operation of data in the memory cell array configured with 1R type memory cell of the nonvolatile semiconductor memory device according to the present invention.

FIG. 9 and FIG. 10 show one example of a procedure for applying voltage to each part during read operation of data in the memory cell array 15 of the present invention device.

First, when reading the data of the selected memory cell, the selected word line connected to the selected memory cell is maintained at ground potential Vss, and during the read period Tr, the read voltage V1 is applied to all of the other non-selected word lines and all the bit lines. During the read period Tr, the voltage difference of read voltage V1 is created between the selected word line and the selected bit line, and thus the electrical resistance, that is, the read current corresponding to the storage state flows to the variable resistor element of the selected memory cell thereby allowing the data stored in the selected memory cell to be read. At this time, the read voltage V1 is similarly applied to the memory cells of the selected memory cells other than the memory cell to be read connected to the non-selected bit lines.

Next, after the read period Tr has elapsed, the voltage V2 (V2=2×V1) having the same polarity and twice the voltage value as the read voltage V1 is applied to the selected word line, and the read voltage V1 is continuously applied to the other non-selected word lines and all the bit lines. As a result, the dummy read voltage having reversed polarity and the same voltage $|V1-V2|(=|V1|)$ as the read voltage V1 is applied to all the selected memory cells connected to the selected word line. During the reproduction period Td of the same time as the read period Tr, the application state of the dummy read voltage is maintained. When switching the selected word line and reading a different selected memory cell, the above operation is similarly repeated in sequence. As a result, the read voltage V1 and the dummy read voltage having reversed polarity and same voltage are applied in pairs temporally one after the other to each selected memory cell. The resistance change of the variable resistor element involved in the read operation of each selected memory cell is thus suppressed. It is to be noted that during the read period Tr, the bit line to be selected may be sequentially switched and a plurality of memory cells may be continuously read.

The effectiveness of the application method of the present example will now be explained based on experimental data. FIG. 6 shows the result in the state of resistance change of when applying the continuous voltage pulse to the variable resistor element, which initial state is at the high resistance state, and in combination therewith, applying the pulse having reversed polarity that flow the current in the opposite direction. It is apparent from FIG. 6 that when comparing a case of continuously applying only the read voltage pulse (voltage amplitude of 2V, pulse width of 100 ns) of positive polarity and a case of alternately applying the read voltage pulse of positive polarity and the dummy read voltage pulse (voltage amplitude of 2V, pulse width of 100 ns) of negative polarity with the initial state in the high resistance state, the resistance change of when both voltage pulses of positive polarity and negative polarity are applied is clearly recognized to be greatly suppressed, which supports the fact that the above described application method is effective.

EXAMPLE 2

A second example of when applying the read voltage to the selected memory cell for read operation of the data and subsequently applying the dummy read voltage for suppressing the resistance change of the selected memory cell will now be explained with reference to FIG. 9 and FIG. 11. In this example, the voltage V2 having a voltage value greater than twice the voltage V1 is provided to the voltage switch circuit 22a of the present invention device shown in FIG. 8.

Figure 11:
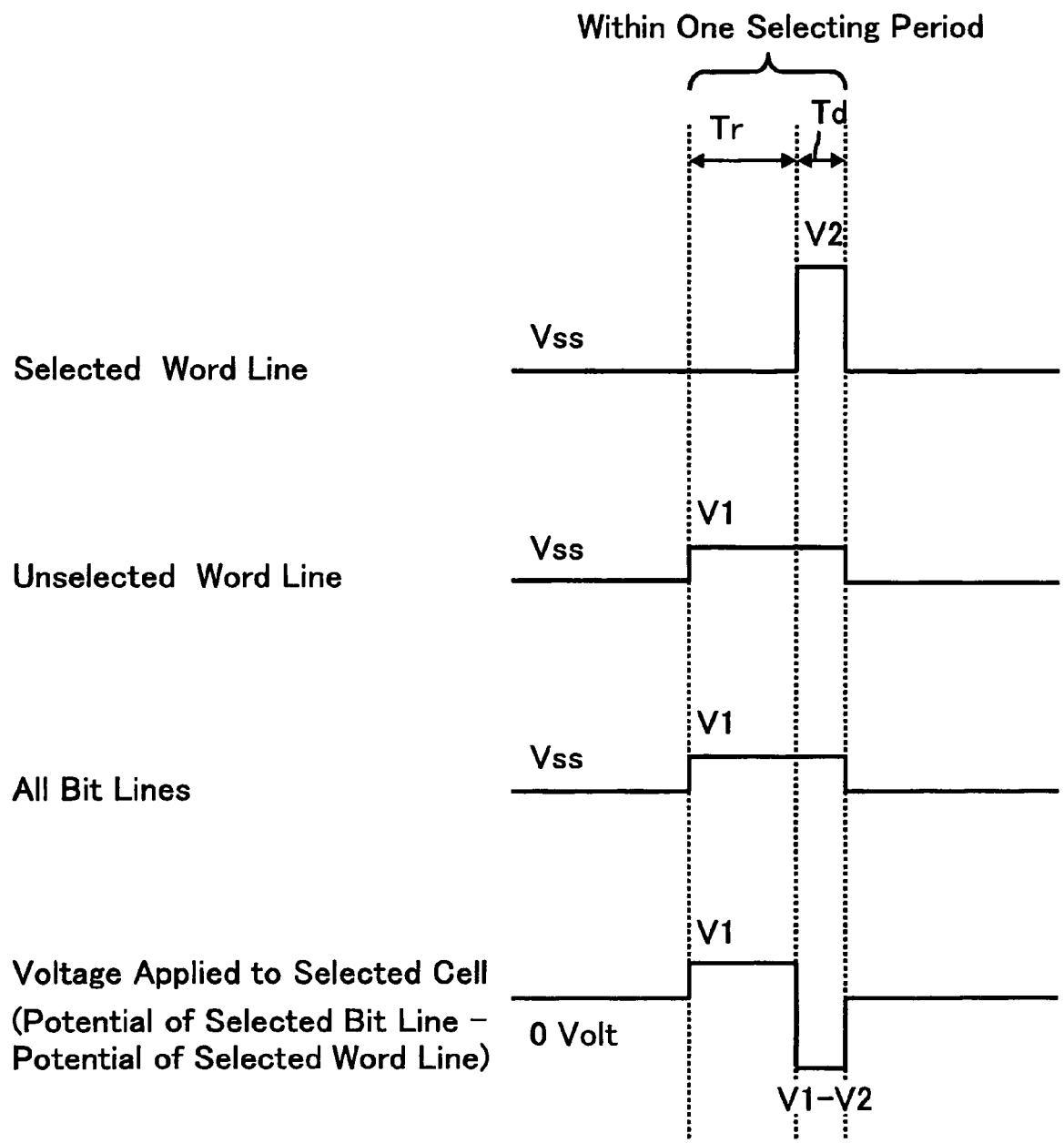
FIG. 11 is a timing diagram showing another example of a procedure for applying a voltage to each word line and each bit line in read operation of data in the memory cell array configured with 1R type memory cell of the nonvolatile semiconductor memory device according to the present invention.

FIG. 9 and FIG. 11 show one example of a procedure for applying voltage to each part during read operation of data in the memory cell array 15 of the present invention device.

First, when reading the data of the selected memory cell, the selected word line connected to the selected memory cell is maintained at ground potential Vss, and during the read period Tr, the read voltage V1 is applied to all of the other non-selected word lines and all the bit lines. During the read period Tr, the voltage difference of read voltage V1 is created between the selected word line and the selected bit line, and thus the electrical resistance, that is, the read current corresponding to the storage state flows to the variable resistor element of the selected memory cell thereby allowing the data stored in the selected memory cell to be read. At this time, the read voltage V1 is similarly applied to the memory cells of the selected memory cells other than the memory cell to be read connected to the non-selected bit lines.

Next, after the read period Tr has elapsed, the voltage V2 (V2>2×V1) having the same polarity and greater than twice the voltage value of the read voltage V1 is applied to the selected word line, and the read voltage V1 is continuously applied to the other non-selected word lines and all the bit lines. As a result, the dummy read voltage having reversed polarity and higher voltage |V1−V2|(=|V1|) from the read voltage V1 is applied to all the selected memory cells connected to the selected word line. However, if the dummy read voltage |V1−V2| is excessively large, the write or erase operation of the data is performed, and thus is set to a voltage lower than the lower limit of the write or erase voltage. During the reproduction period Td shorter than the read period Tr, the application state of the dummy read voltage is maintained. Since the dummy read voltage |V1−V2| is greater than the read voltage |V1|, even if the reproduction period Td is shorter than the read period Tr, the resistance change of the variable resistor element caused by the application of the read voltage V1 is returned in the reverse direction and the resistance change by a series of operations is suppressed. When switching the selected word line and reading a different selected memory cell, the above operation is similarly repeated in sequence. As a result, the read voltage V1 and the dummy read voltage having reversed polarity and higher voltage as the read voltage V1 are applied in pairs temporally one after the other to each selected memory cell. The resistance change of the variable resistor element involved in the read operation of each selected memory cell is thus suppressed. It is to be noted that during the read period Tr, the bit line to be selected may be sequentially switched and a plurality of memory cells may be continuously read.

Figure 12:
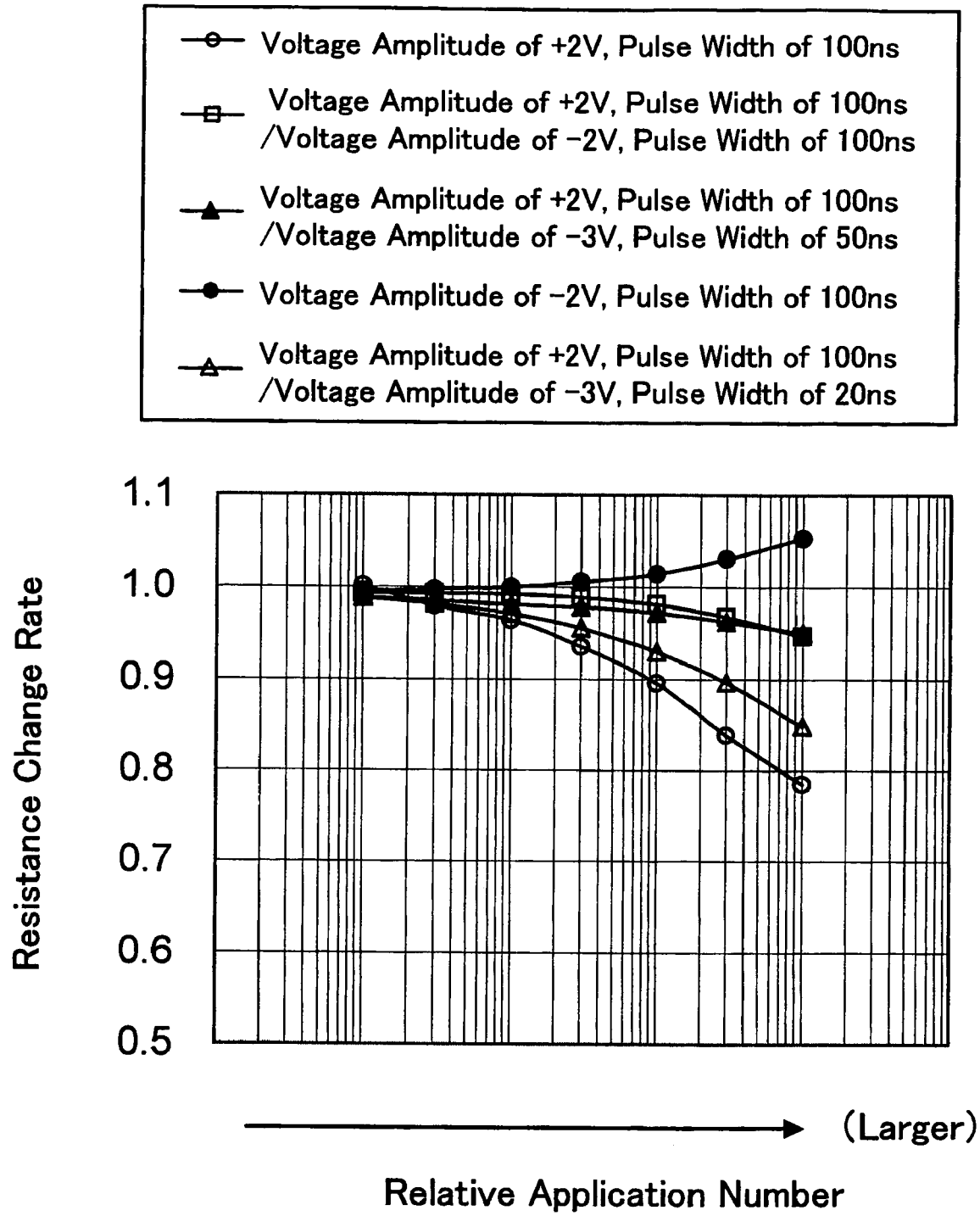
FIG. 12 is another characteristic diagram showing the relationship of voltage pulse application and resistance change with respect to the variable resistor element which initial state is in a high resistance state.

The effectiveness of the application method of the present example will now be explained based on experimental data. FIG. 12 shows the result in the state of resistance change of when the voltage amplitude and the pulse width of the reverse polarity pulse are changed for a case of applying the continuous voltage pulse to the variable resistor element, which initial state is at the high resistance state, and in combination therewith, applying the pulse having reversed polarity pulse that flow the current in the opposite direction. The measurement conditions of the resistance value shown in FIG. 12 are derived from the current value of when the ground voltage acting as the reference is provided to the lower electrode and 0.5V is applied to the upper electrode. Open circles in FIG. 12 show an example of resistance change when the voltage pulse of positive polarity is continuously applied (voltage amplitude of 2V, pulse width of 100 ns). Further, filled circles in FIG. 12 show an example of resistance change when the voltage pulse of negative polarity is continuously applied (voltage amplitude of −2V, pulse width of 100 ns). Open squares, filled triangles, and open triangles show examples of resistance change when the voltage pulses of positive polarity and negative polarity are alternately applied. Open squares show an example of resistance change when the voltage pulse of positive polarity (voltage amplitude of 2V, pulse width of 100 ns) and the voltage pulse of negative polarity (voltage amplitude of −2V, pulse width of 100 ns) are alternately applied. Filled triangles show an example of resistance change when the amplitude of the negative voltage pulse is assumed as −3V, and the pulse width thereof is assumed as 50 ns. Open triangles show an example of resistance change when the amplitude of the negative voltage pulse is assumed as −3V, and the pulse width thereof is assumed as 20 ns. The axis of abscissa of FIG. 12 is the logarithmic representation of the relative application number of the voltage pulse. It is apparent from FIG. 12 that suppression effect of the resistance change is obtained similar to when the voltage amplitude and the pulse width of the reversed polarity pulse is the same as the read voltage pulse by having the voltage amplitude large even if the pulse width of the reversed polarity pulse is made short. For instance, from FIG. 12, comparing a case in which the read voltage pulse of positive polarity and the dummy read voltage pulse (voltage amplitude 2V, pulse width 100 ns) of negative polarity are alternately applied, and a case in which the read voltage pulse (voltage amplitude 2V, pulse width 100 ns) of positive polarity and the dummy read voltage pulse (voltage amplitude 3V, pulse width 50 ns) of negative polarity are alternately applied with respect to a case in which only the read voltage pulse (voltage amplitude 2V, pulse width 100 ns) of positive polarity is continuously applied with the initial state in a high resistance state, the suppression effect of the resistance change to the same extent is recognized in the voltage pulse application of either positive polarity or negative polarity. Therefore, the experimental data of FIG. 12 supports the fact that the application method of the present example is effective.

Further, in the present example, as the reproduction period Td is shorter than the read period Tr, the read cycle time in the same memory cell array defined by the total time of the read period Tr and the reproduction period Td becomes short. It is to be noted that although the reproduction period Td is shorter than the read period Tr, it may also be the same as the read period Tr.

EXAMPLE 3

Figure 13:
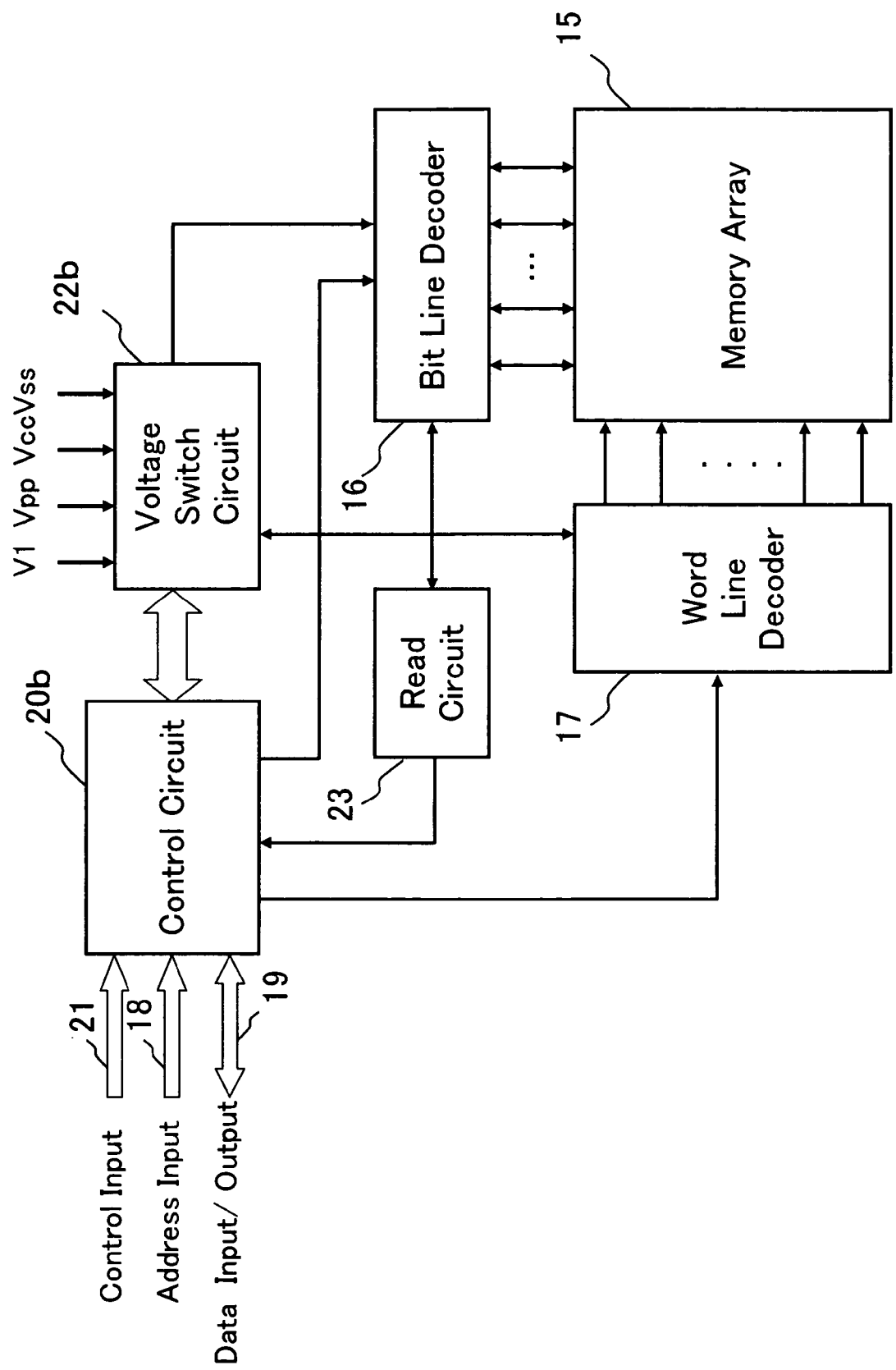
FIG. 13 is a block diagram showing another configuration example of a nonvolatile semiconductor memory device according to the present invention including the memory cell array of 1R type memory cell.

A third example of when applying the read voltage to the selected memory cell for read operation of the data and subsequently applying the dummy read voltage for suppressing the resistance change of the selected memory cell will now be explained with reference to FIG. 13 to FIG. 15.

Figure 14:
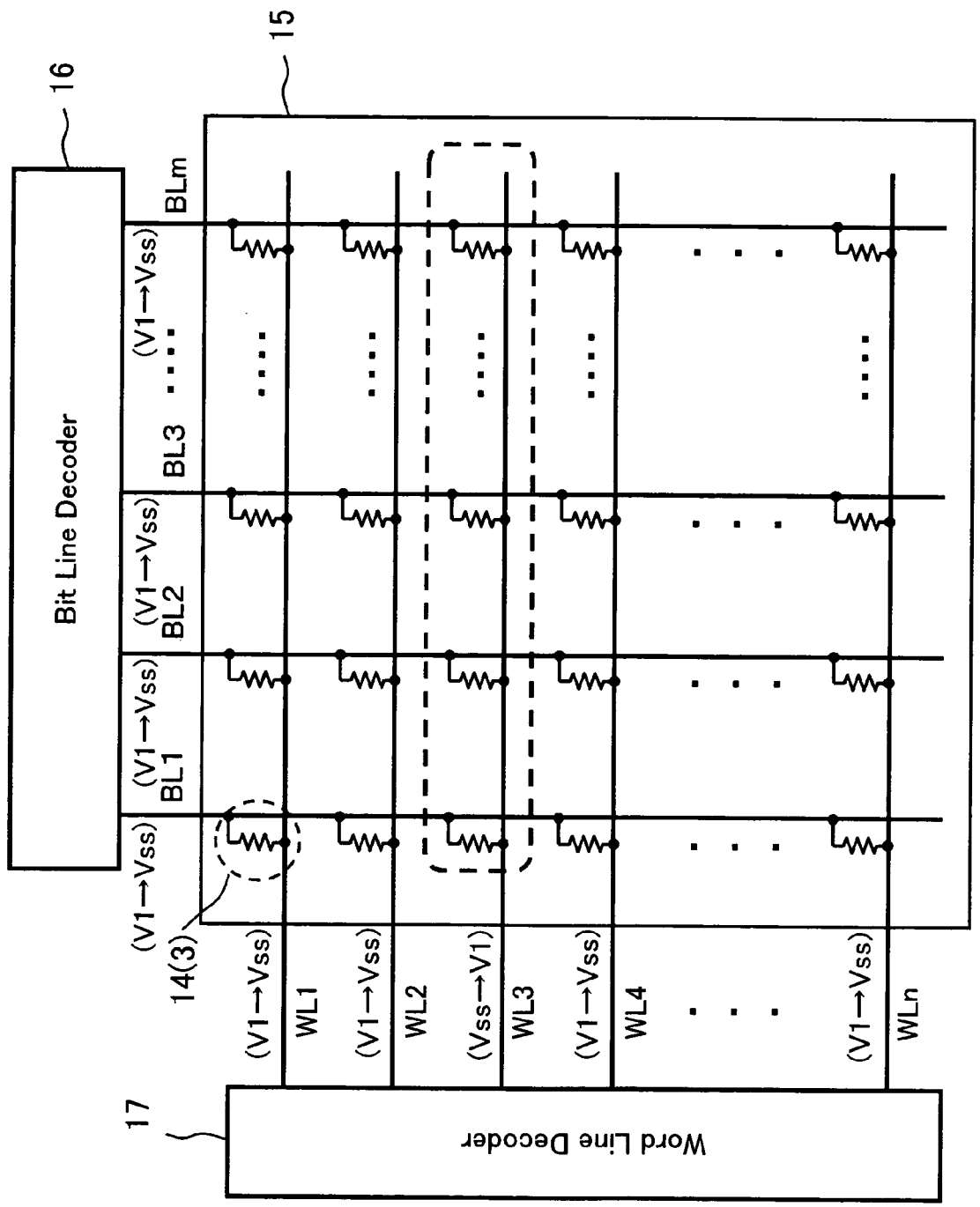
FIG. 14 is a circuit diagram showing a frame format of one configuration example of a memory cell array of 1R type memory cell and another example of voltage application procedure in the nonvolatile semiconductor memory device according to the present invention.
Figure 15:
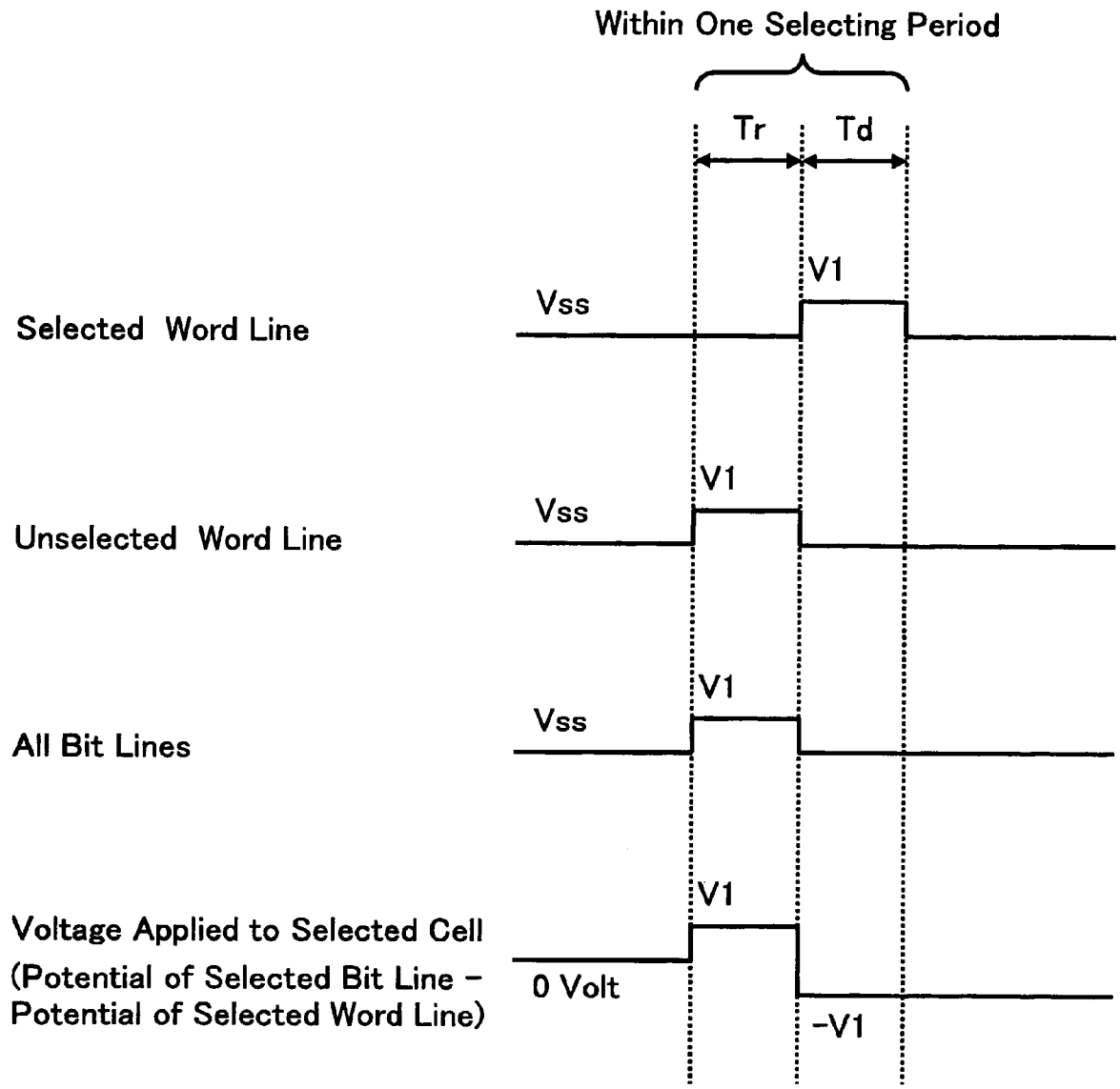
FIG. 15 is a timing diagram showing another example of a procedure for applying a voltage to each word line and each bit line in read operation of data in the memory cell array configured with 1R type memory cell of the nonvolatile semiconductor memory device according to the present invention.

FIG. 14 and FIG. 15 show one example of a procedure for applying voltage to each part during read operation of data in the memory cell array 15 of the present invention device. The voltage V2 used in examples 1 and 2 is not provided to the voltage switch circuit 22b of the present invention device shown in FIG. 13. The difference between the present invention device shown in FIG. 13 and the conventional nonvolatile semiconductor memory device shown in FIG. 5 lies in the voltage applied from the voltage switch circuit 22b to the memory cell array 15 and the timing operation thereof, and the operation of the control circuit 20b for controlling the operation of the voltage switch circuit 22b. This difference is not shown in FIG. 13, and thus will be explained below.

First, when reading the data of the selected memory cell, the selected word line connected to the selected memory cell is maintained at ground potential Vss, and during the read period Tr, the read voltage V1 is applied to all of the other non-selected word lines and all the bit lines. During the read period Tr, the voltage difference of read voltage V1 is created between the selected word line and the selected bit line, and thus the electrical resistance, that is, the read current corresponding to the storage state flows to the variable resistor element of the selected memory cell thereby allowing the data stored in the selected memory cell to be read. At this time, the read voltage V1 is similarly applied to the memory cells of the selected memory cells other than the memory cell to be read connected to the non-selected bit line.

Next, after the read period Tr has elapsed, the read voltage V1 is applied to the selected word line, and the other non-selected word lines and all the bit lines are returned to the ground potential Vss. As a result, the dummy read voltage having reversed polarity and the same voltage |V1| as the read voltage V1 is applied to all the selected memory cells connected to the selected word line. During the reproduction period Td of the same time as the read period Tr, the application state of the dummy read voltage is maintained. When switching the selected word line and reading a different selected memory cell, the above operation is similarly repeated in sequence. As a result, the read voltage V1 and the dummy read voltage having reversed polarity and same voltage as the read voltage V1 are applied in pairs temporally one after the other to each selected memory cell. The resistance change of the variable resistor element involved in the read operation of each selected memory cell is thus suppressed. It is to be noted that during the read period Tr, the bit line to be selected may be sequentially switched and a plurality of memory cells may be continuously read.

EXAMPLE 4

Figure 16:
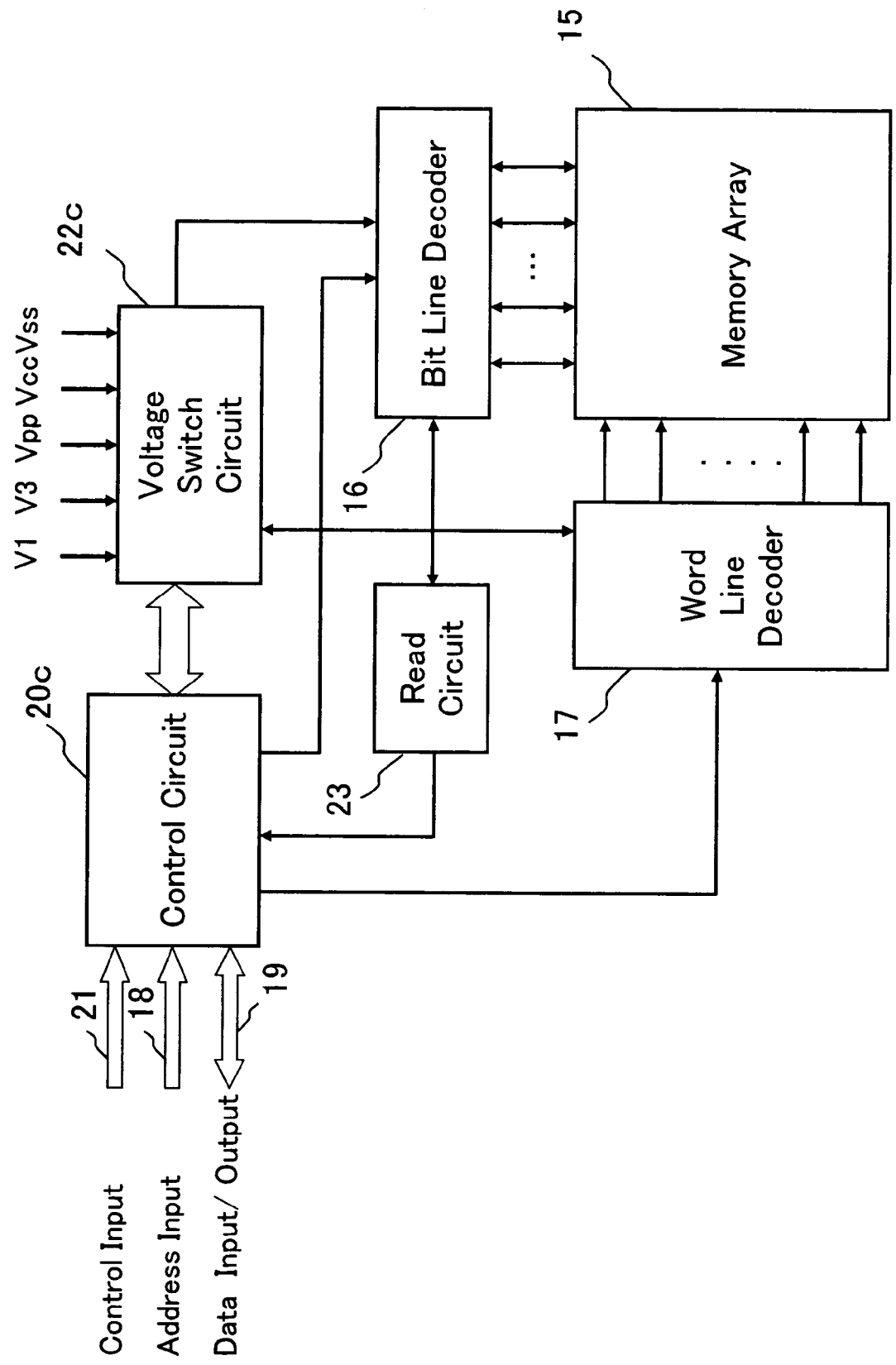
FIG. 16 is a block diagram showing another configuration example of a nonvolatile semiconductor memory device according to the present invention including the memory cell array of 1R type memory cell.

A fourth example of when applying the read voltage to the selected memory cell for read operation of the data and subsequently applying the dummy read voltage for suppressing the resistance change of the selected memory cell will now be explained with reference to FIG. 16 to FIG. 18. In this example, the voltage V3 having a voltage value greater than the voltage V1 is provided to the voltage switch circuit 22c of the present invention device shown in FIG. 16 in place of the voltage V2 used in examples 1 and 2.

Figure 17:
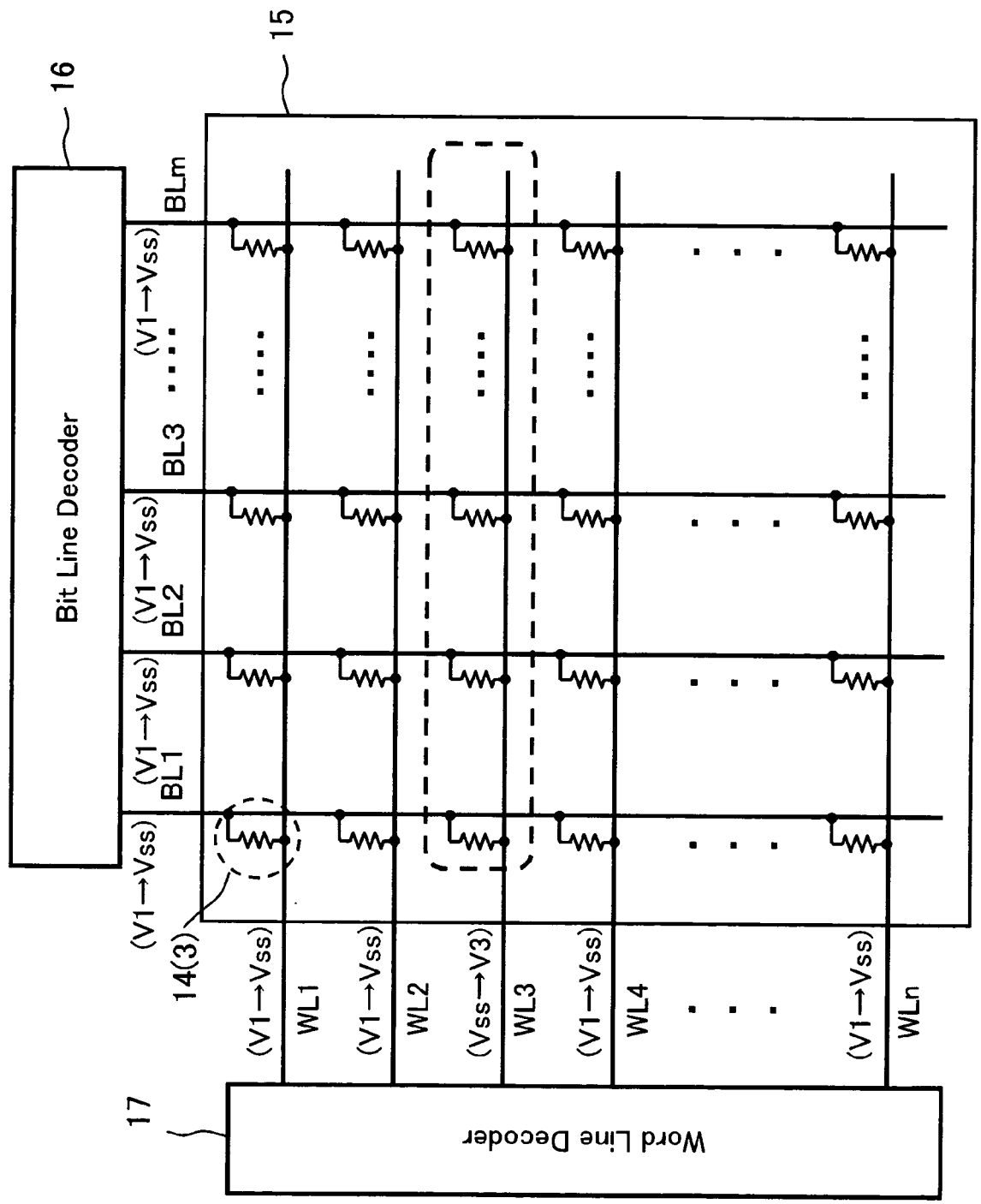
FIG. 17 is a circuit diagram showing a frame format of one configuration example of a memory cell array of 1R type memory cell and another example of voltage application procedure in the nonvolatile semiconductor memory device according to the present invention.
Figure 18:
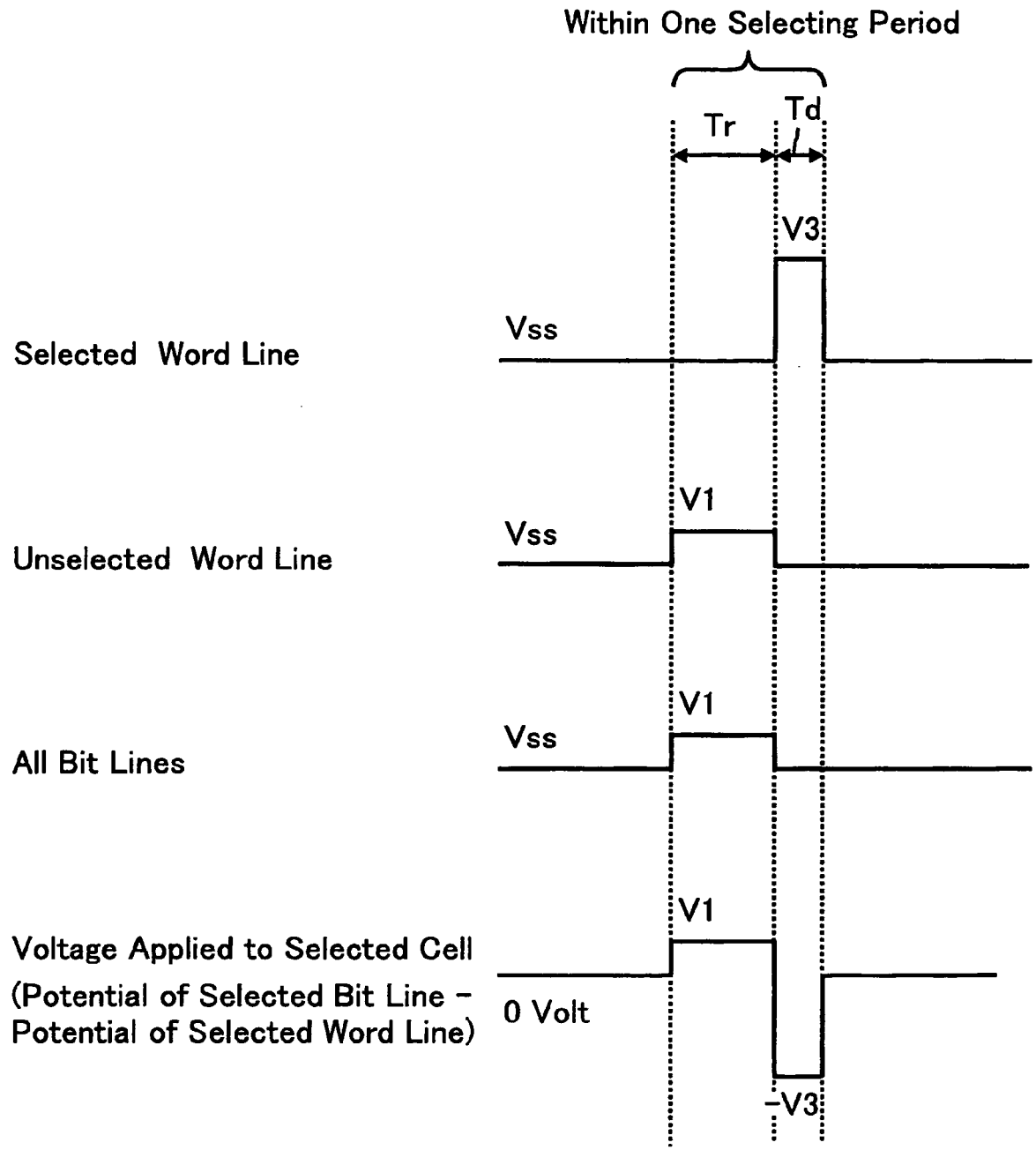
FIG. 18 is a timing diagram showing another example of a procedure for applying a voltage to each word line and each bit line in read operation of data in the memory cell array configured with 1R type memory cell of the nonvolatile semiconductor memory device according to the present invention.

FIG. 17 and FIG. 18 show one example of a procedure for applying voltage to each part during read operation of data in the memory cell array 15 of the present invention device. The difference between the present invention device shown in FIG. 16 and the conventional nonvolatile semiconductor memory device of FIG. 5 lies in the voltage applied from the voltage switch circuit 22c to the memory cell array 15 and the timing operation thereof, and the operation of the control circuit 20c for controlling the operation of the voltage switch circuit 22c.

First, when reading the data of the selected memory cell, the selected word line connected to the selected memory cell is maintained at ground potential Vss, and during the read period Tr, the read voltage V1 is applied to all of the other non-selected word lines and all the bit lines. During the read period Tr, the voltage difference of read voltage V1 is created between the selected word line and the selected bit line, and thus the electrical resistance, that is, the read current corresponding to the storage state flows to the variable resistor element of the selected memory cell thereby allowing the data stored in the selected memory cell to be read. At this time, the read voltage V1 is similarly applied to the memory cells of the selected memory cells other than the memory cell to be read connected to the non-selected bit line.

Next, after the read period Tr has elapsed, the read voltage V3 is applied to the selected word line, and the other non-selected word lines and all the bit lines are returned to the ground potential Vss. As a result, the dummy read voltage having reversed polarity and higher voltage |V3|(>|V1|) from the read voltage V1 is applied to all the selected memory cells connected to the selected word line. If the dummy read voltage |V3| is excessively large, the write or erase operation of the data is performed, and thus is set to a voltage lower than the lower limit of the write or erase voltage. During the reproduction period Td of the same or shorter than the read period Tr, the application state of the dummy read voltage is maintained. Since the dummy read voltage |V3| is greater than the read voltage |V1|, even if the reproduction period Td is shorter than the read period Tr, the resistance change of the variable resistor element caused by the application of the read voltage V1 is returned in the reverse direction and the resistance change by a series of operations is suppressed. When switching the selected word line and reading a different selected memory cell, the above operation is similarly repeated in sequence. As a result, the read voltage V1 and the dummy read voltage having reversed polarity and higher voltage having are applied in pairs temporally one after the other to each selected memory cell. The resistance change of the variable resistor element involved in the read operation of each selected memory cell is thus suppressed. It is to be noted that during the read period Tr, the bit line to be selected may be sequentially switched, and a plurality of memory cells may be continuously read.

Second Embodiment

Figure 19:
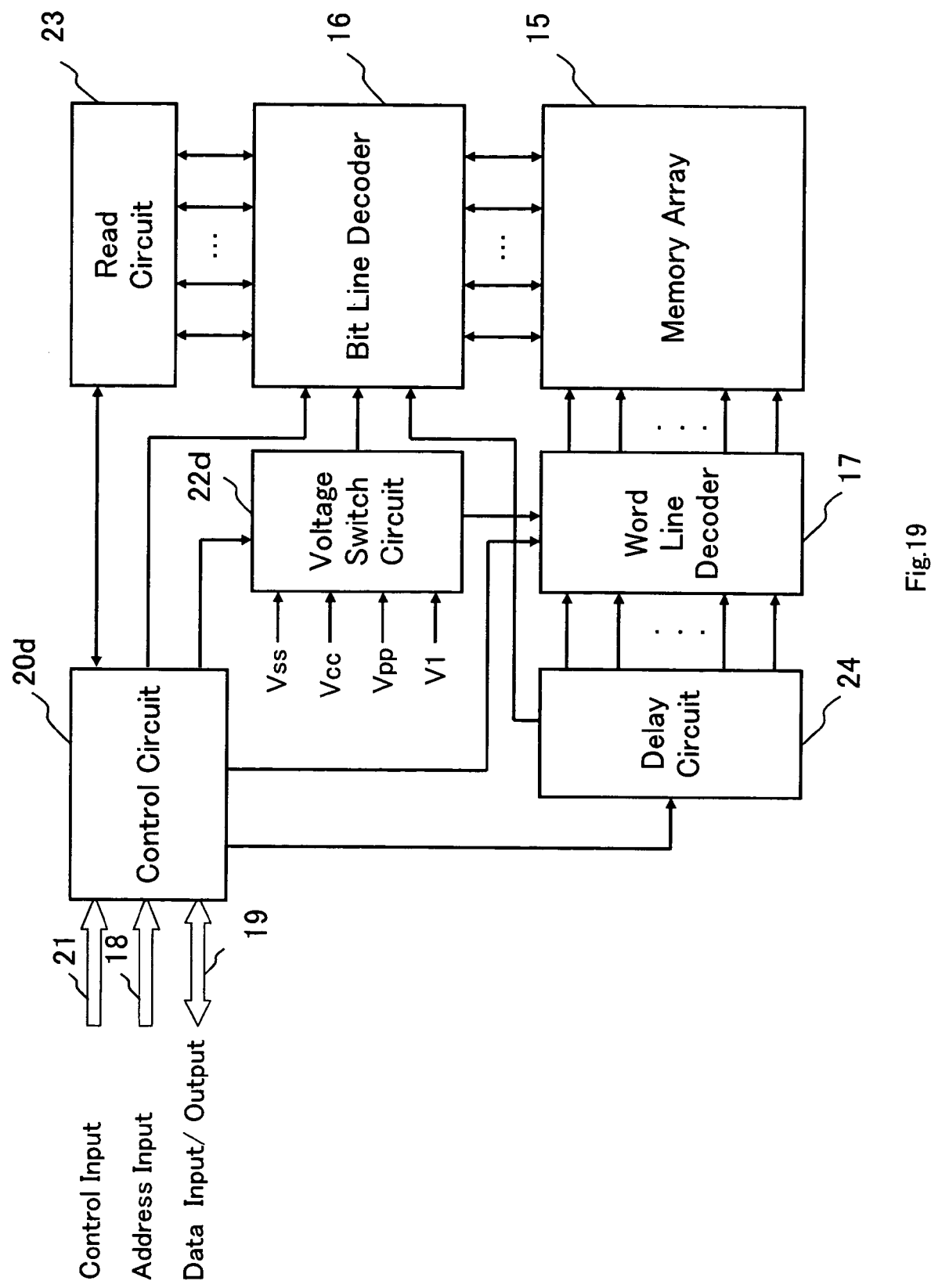
FIG. 19 is a block diagram showing another configuration example of a nonvolatile semiconductor memory device according to the present invention including the memory cell array of 1R type memory cell.

FIG. 19 shows a block configuration example according to a second embodiment of the present invention device. In FIG. 19, the parts in common with the first embodiment shown in FIG. 8, FIG. 13 and FIG. 16 will be explained denoted with the same reference characters. As shown in FIG. 19, the present invention device is configured including the bit line decoder 16, the word line decoder 17, the voltage switch circuit 22d, the read circuit 23, the control circuit 20d and a delay circuit 24 on the periphery of the memory cell array 15 in which the 1R type memory cell (not shown) is arrayed in a matrix form. This configuration is formed by adding the delay circuit 24 to the present invention device of the first embodiment shown in FIG. 13. The function of each part other than the delay circuit 24 is the same as the first embodiment, and thus redundant explanations will be omitted.

In the second embodiment, the voltage applied from the voltage switch circuit 22d to the memory cell array 15 and the timing thereof are controlled by the control circuit 20d and the delay circuit 24. Further, they are controlled so as to apply the dummy read voltage for suppressing the resistance change of the selected memory cell before applying the read voltage to the selected memory cell for read operation of the data. One example of a procedure for applying voltage to each part in the read operation of data in the memory cell array 15 of the present invention device will now be explained with reference to FIG. 20 and FIG. 21.

Figure 20:
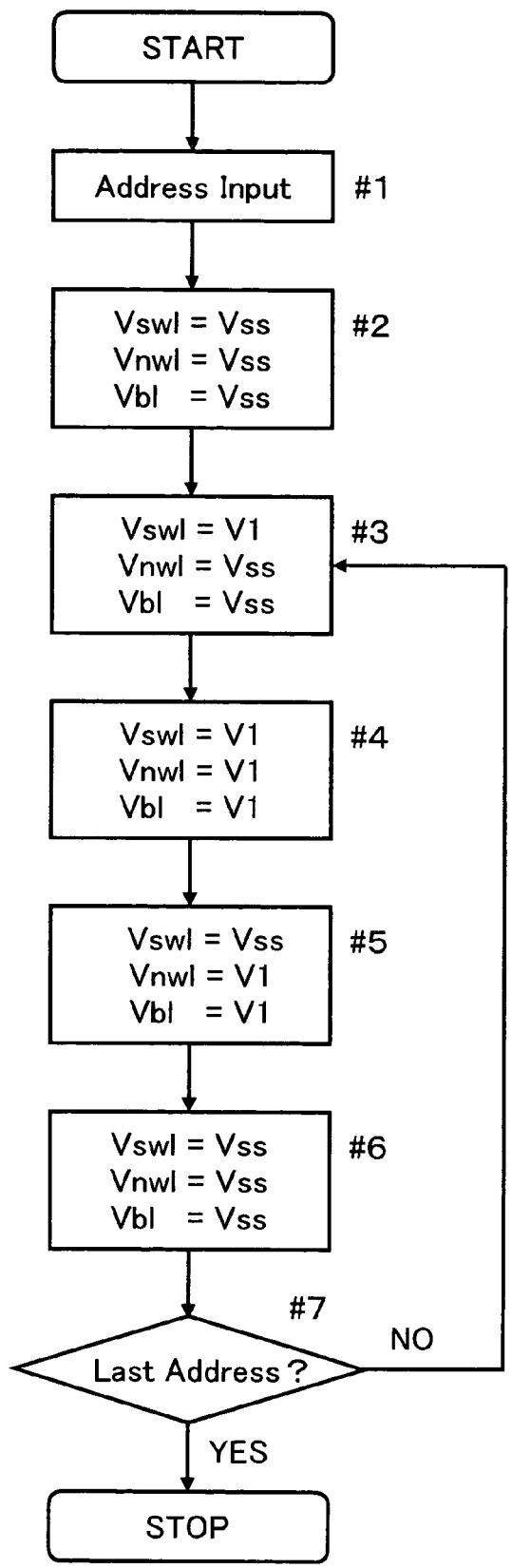
FIG. 20 is a flow chart showing another example of a procedure for applying a voltage to each word line and each bit line in read operation of data in the memory cell array configured with 1R type memory cell of the nonvolatile semiconductor memory device according to the present invention.
Figure 21:
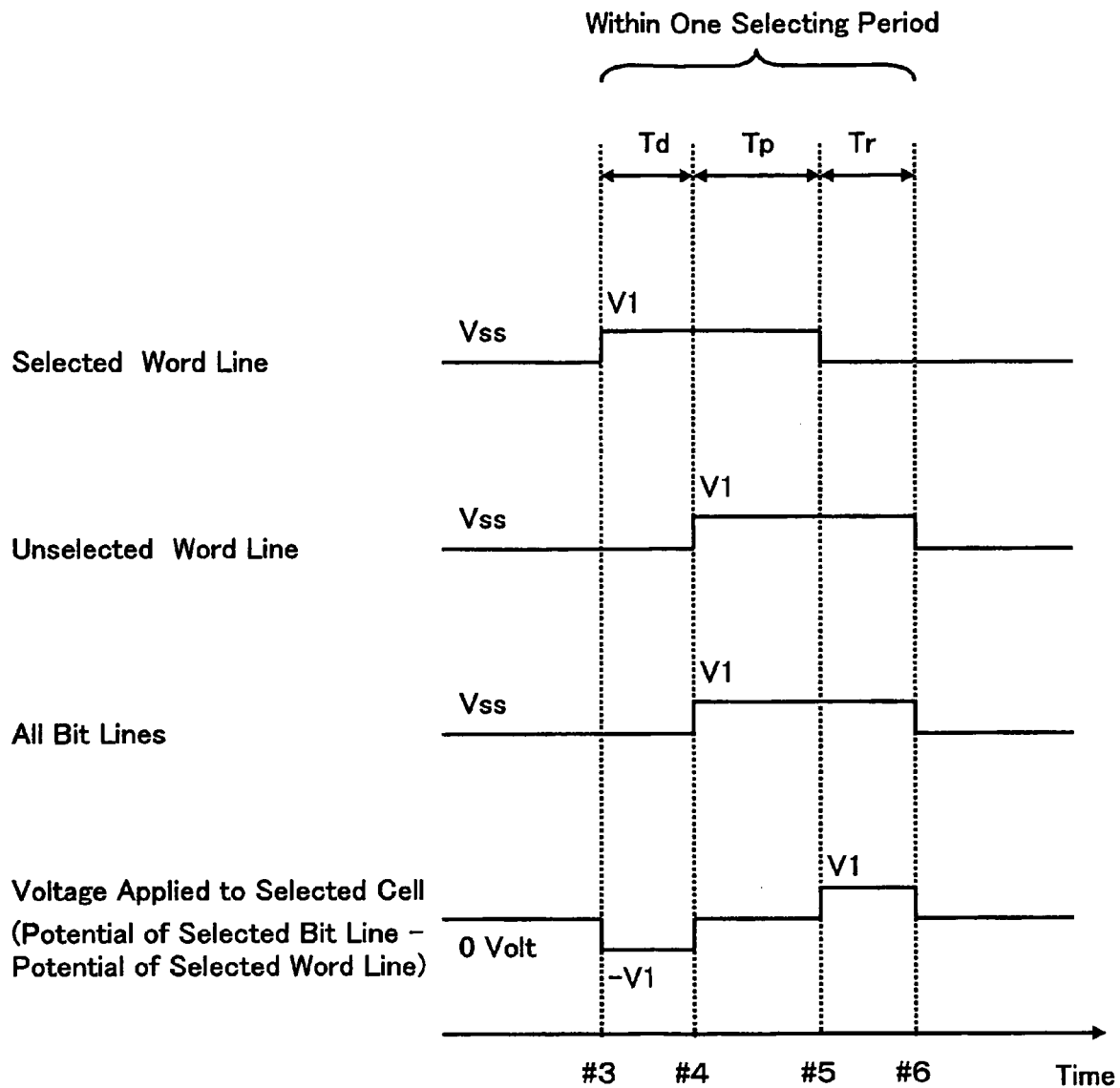
FIG. 21 is a timing diagram showing another example of a procedure for applying a voltage to each word line and each bit line in read operation of data in the memory cell array configured with 1R type memory cell of the nonvolatile semiconductor memory device according to the present invention.

FIG. 20 is a flow chart showing one example of the voltage application procedure on each part in the read operation of data with respect to a plurality of addresses. FIG. 21 is a timing waveform chart showing the voltage application timing for each bit line and each word line of the memory cell array 15.

First, the head address is input via the address line 18 (#1). Next, all the bit lines and the word lines of the memory cell array where the memory cell to be read is located are set to the ground potential Vss (#2). In FIG. 20, Vsw1, Vnw1, and Vb1 each shows the voltage level of the selected word line, the voltage level of the non-selected word line, and the voltage level of the bit line.

A first pulse of voltage amplitude V1 is applied to the selected word line while maintaining the voltage levels of the non-selected word line and the bit line at ground potential Vss (#3). The pulse width of the first pulse is adjusted in the delay circuit 24 so as to become the total time of the reproduction period Td and the pre-charge period Tp to be hereinafter described. With the delay circuit 24, a second pulse of the same voltage amplitude V1 that rises later than the first pulse by the delay time equivalent to the reproduction period Td, and that lowers later than the first pulse by the delay time equivalent to the read period Tr is applied to the non-selected word line and all the bit lines (#4). The pulse width of the second pulse is adjusted in the delay circuit 24 so as to become the total time of the pre-charge period Tp and the read period Tr. The application of the dummy read voltage for relieving the resistance change created at the selected memory cell in the read operation performed afterwards is performed in advance in the reproduction period Td between the application of the first pulse (#3) and the application of the second pulse (#4). During the pre-charge period Tp (from #4 to #5), all the bit lines and the word lines are applied with voltage V1 and made to the same potential, and thus the potential difference on all the memory cells is 0V.

After the pre-charge period Tp has elapsed, the application of the first pulse to the selected word line is stopped while the application of the second pulse to the non-selected word lines and the bit lines is maintained (#5). Thereafter, after the read period Tr has elapsed, the application of the second pulse to the non-selected word lines and the bit lines is stopped and the non-selected word lines and the bit lines are set to ground potential Vss (#6). During the read period Tr (from #5 to #6), the voltage difference of read voltage V1 is created between the selected word line and the selected bit line, and thus the electrical resistance, that is, the read current corresponding to the storage state flows to the variable resistor element of the selected memory cell thereby allowing the data stored in the selected memory cell to be read. More specifically, the read current flows into all the selected memory cells connected to the selected word line, but among them, the read current flowing through the selected bit line selected by the bit line decoder 16 is voltage converted, the state of the stored data of the memory cell to be read is determined, and the result thereof is transferred to the control circuit 20d, which then outputs the same to the data line 19. By sequentially performing the processes of #3 to #6 on each address, the application of the read voltage (V1) and the application of the dummy read voltage (−V1) having reversed polarity and the same voltage as the read voltage are performed in pairs to all the memory cells selected with respect to the plurality of address inputs. The resistance change of the variable resistor element involved in the read operation of each selected memory cell is thus suppressed.

The electrical stress imposed on the selected memory cell within one selecting period until the selected memory cell is switched to the next selected memory cell based on the address input is represented as V1×(Tr−Td) or the product of the voltage value and the time. In order to reduce the electrical stress, the delay time between the first pulse and the second pulse of the delay circuit 24 is preferably adjusted so that the read period Tr and the reproduction period Td become the same. Further, as the access time to each selected memory cell is defined by the delay time and the pulse width between the first pulse and the second pulse of the delay circuit 24, the setting corresponding to the desired access time is preferably performed.

Figure 22:
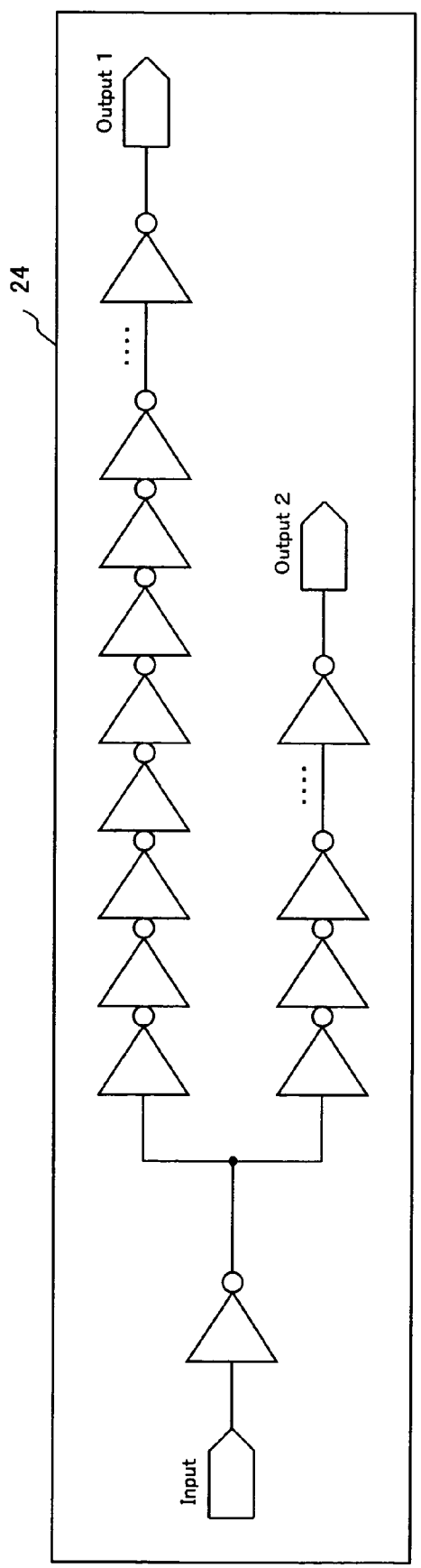
FIG. 22 is a circuit diagram showing one configuration example of a delay circuit in one embodiment of the nonvolatile semiconductor memory device according to the present invention.

FIG. 22 shows a circuit configuration example of the delay circuit 24 of the present embodiment. One example of the delay circuit 24 is configured with an inverter string of two systems having different delay time. The reference pulse acting as the base of the first pulse and the second pulse is input to the input, and the second pulse is output from output 1 and the first pulse is output from output 2 each at a different delay time. The generation circuit of the first pulse and the second pulse is not limited to the circuit configured only by the inverter string of FIG. 22, and may be configured by appropriately combining a logic gate such as, a NAND gate, a NOR gate and the like.

Third Embodiment

Figure 23:
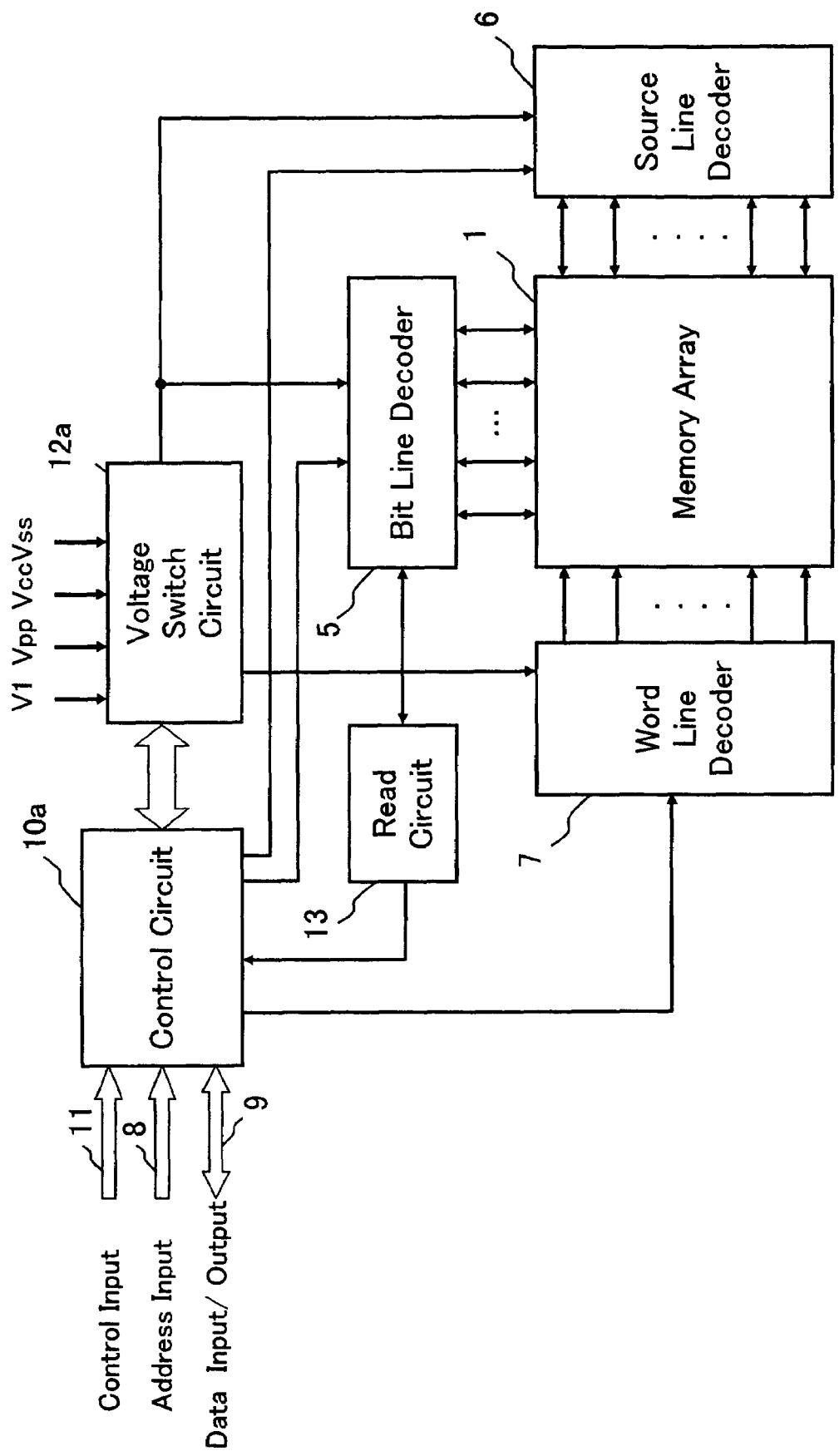
FIG. 23 is a block diagram showing one configuration example of the nonvolatile semiconductor memory device according to the present invention including the memory cell array of 1T/1R memory cell.

A third embodiment of the present invention device will now be explained. FIG. 23 shows a block configuration example according to the third embodiment of the present invention device. In FIG. 23, the parts in common with the conventional nonvolatile semiconductor memory device will be explained denoted with the same reference characters. In the third embodiment, the present invention device is configured including the bit line decoder 5, the source line decoder 6, the word line decoder 7, the voltage switch circuit 12a, the read circuit 13 and the control circuit 10a arranged on the periphery of the memory cell array 1 in which the 1T/1R type memory cell (not shown) is arrayed in a matrix form. The specific memory cell in the memory cell array 1 corresponding to the address input, which is input from the address line 8 to the control circuit 10a, is selected by the bit line decoder 5, the source line decoder 6, and the word line decoder 7, each operation of write, erase, and read of the data is performed, and the data is stored into and read out from the selected memory cell. The input/output of the data with the external device (not shown) is performed via the data line 9. Basically, the configuration is the same as the configuration of the conventional nonvolatile semiconductor memory device comprising the memory cell array of 1T/1R type memory cell shown in FIG. 2. The difference with the conventional nonvolatile semiconductor memory device of FIG. 2 lies in the voltage applied from the voltage switch circuit 12a to the memory cell array 1 and the timing operation thereof, and the operation of the control circuit 10a for controlling the operation of the voltage switch circuit 12a.

Figure 1:
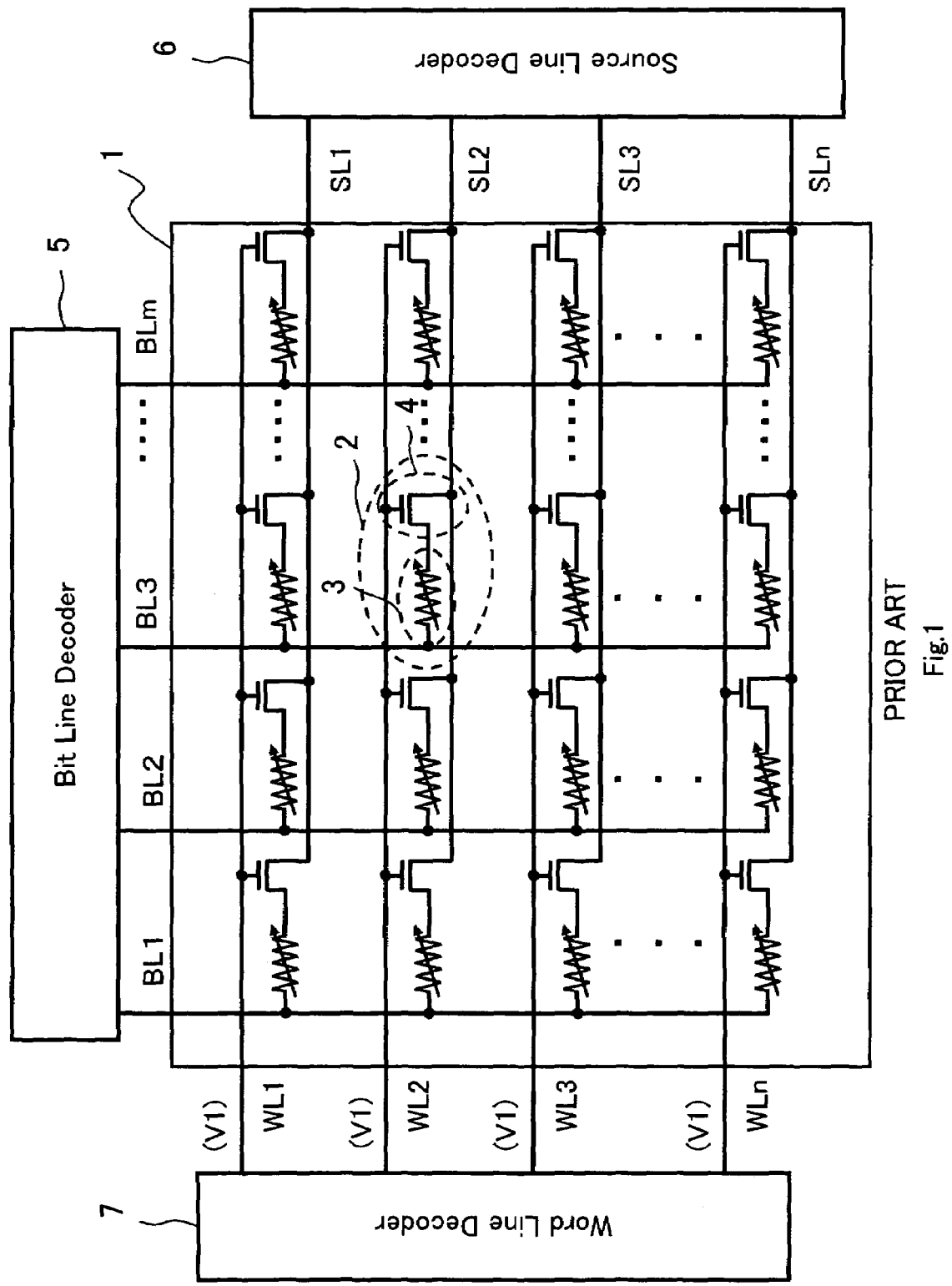
FIG. 1 is a circuit diagram showing a frame format of one configuration example of a memory cell array of 1T/1R type memory cell including a variable resistor element and a selective transistor.

Further, the configuration of the memory cell array 1 is the same as the configuration of the memory cell array 1 of the conventional nonvolatile semiconductor memory device shown in FIG. 1. More specifically, the memory cell array 1 has a configuration in which m×n numbers of memory cells 2 are each arranged at the intersection of m number of bit lines (BL1 to BLm) extending in the column direction and n number of word lines extending in the row direction. Further, n number of source lines (SL1 to SLn) is arranged parallel to the word line. In each memory cell, the upper electrode of the variable resistor element 3 is connected to the drain electrode of the selective transistor 4, the lower electrode of the variable resistor element 3 is connected to the bit line, the gate electrode of the selective transistor 4 is connected to the word line, and the source electrode of the selective transistor 4 is connected to the source line. It is to be noted that the relationship between the upper electrode and the lower electrode of the variable resistor element 3 may be inverted, or the lower electrode of the variable resistor element 3 may be connected to the drain electrode of the selective transistor 4, and the upper electrode of the variable resistor element 3 may be connected to the bit line.

The word line decoder 7 selects the word line of the memory cell array 1 corresponding to the signal input to the address line 8, the bit line decoder 5 selects the bit line of the memory cell array 1 corresponding to the address signal input to the address line 8, and the source line decoder 6 selects the source line of the memory cell array 1 corresponding to the address signal input to the address line 8. The bit line decoder 5, the source line decoder 6, and the word line decoder 7 function as a memory selecting circuit for selecting at least one memory cell in the memory cell array 1 corresponding to the address input, which is input from the address line 8 to the control circuit 10a, in memory cell units.

The control circuit 10a performs control in each operation of write, erase, and read of the memory cell array 1. The control circuit 10a controls the word line decoder 7, the bit line decoder 5, the source line decoder 6, the voltage switch circuit 12a, and read, write and erase operations of the memory cell array 1 based on the address signal input from the address line 8, the data input (during write) input from the data line 9, and the control input signal input from the control signal line 11. In the example shown in FIG. 23, the control circuit 10a has functions serving as, although not shown, a general address buffer circuit, a data input/output buffer circuit, and a control input buffer circuit.

The voltage switch circuit 12a switches and provides to the memory cell array 1, each voltage of the word line, the bit line, and the source line necessary for read, write and erase of the memory cell array 1 in accordance with the operation mode. In particular, in the read mode, the voltage switch circuit 12a functions as a read voltage application circuit for applying a predetermined read voltage to the bit line, the word line and the source line connected to the selected memory cell via the bit line decoder 5, the source line decoder 6, and the word line decoder 7. In the figure, Vcc is the power supply voltage of the nonvolatile semiconductor memory device, Vss is the ground voltage, Vpp is the write or erase voltage, and V1 is the read voltage. The data is read from the memory cell array 1 through the bit line decoder 5 and the read circuit 13. The read circuit 13 determines the state of the data, and transfers the result thereof to the control circuit 10a, which then outputs the same to the data line 9.

An example of a procedure for applying voltage pulse from the voltage switch circuit 12a to each bit line, each word line, and each source line of the memory cell array 1 in the read operation will now be explained. In case of 1T/1R type memory cell, the selective transistor is included in the memory cell, and application of read voltage only to the variable resistor element of the selected memory cell to be read becomes possible, and only the selected memory cell applied with the read voltage may be made the memory cell to be read. The resistance change of the variable resistor element involved in the read operation is thus limited only to the memory cell to be read. Therefore, the application of the dummy read voltage for relieving the resistance change is also limited only to the memory cell to be read.

Figure 24:
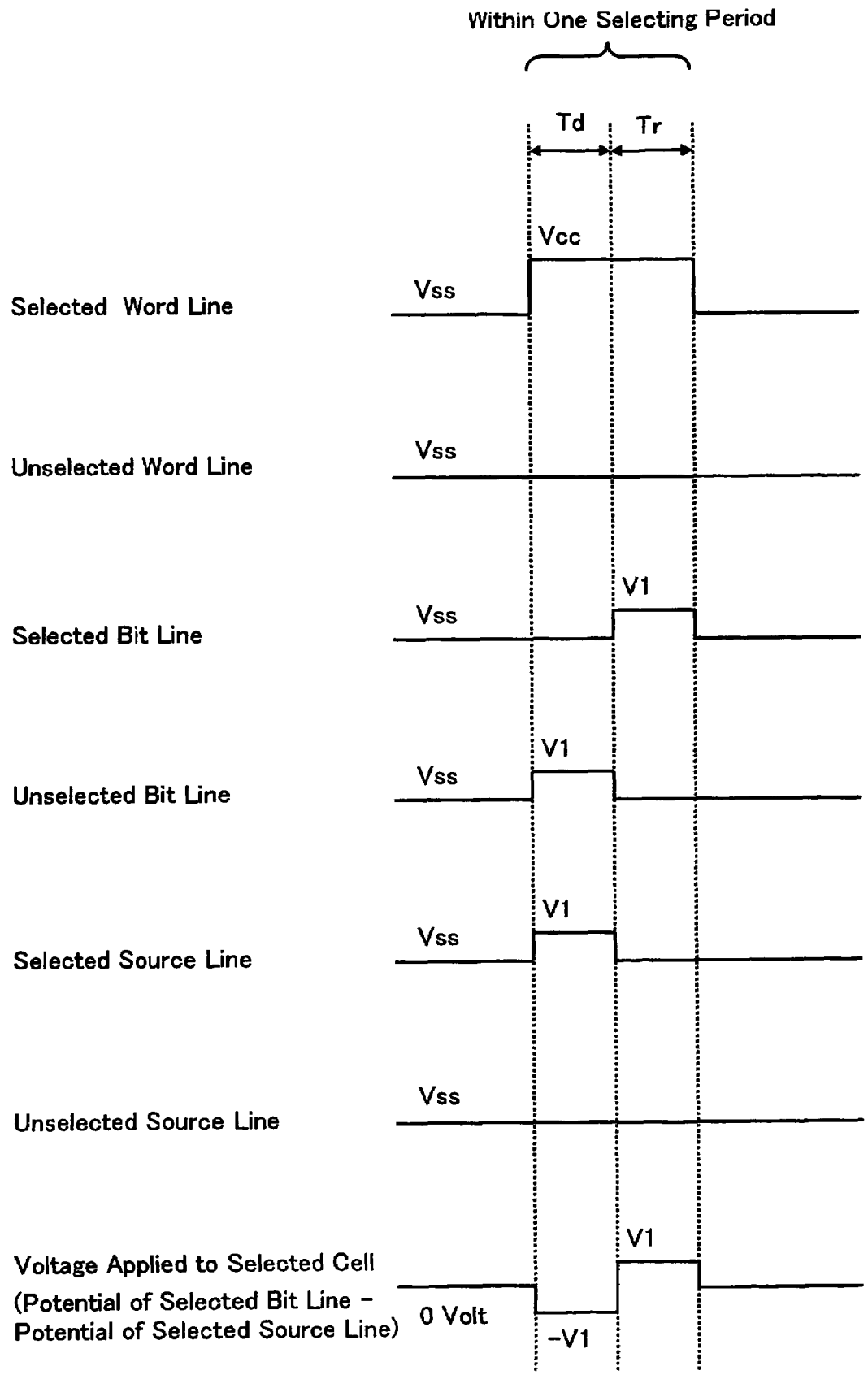
FIG. 24 is a timing diagram showing one example of a procedure for applying a voltage to each word line, each bit line and each source line in read operation of data in the memory cell array configured with 1T/1R type memory cell of the nonvolatile semiconductor memory device according to the present invention.

A case of applying the dummy read voltage for suppressing the resistance change of the selected memory cell before applying the read voltage to the selected memory cell for read operation of data will first be explained with reference to FIG. 24.

First, the potential of the selected word line connected to the selected memory cell is increased from the state in which all of the word lines, the bit lines, and the source lines are at the ground potential Vss to the power supply voltage Vcc to turn on the selective transistor of one row of memory cells connected to the selected word line. Simultaneously, the voltage V1 is applied to the selected source line and the non-selected bit line connected to the memory cells of the same row. Since the potential of the selected bit line remains at ground potential Vss, Vss (=0V) is applied on the bit line side and V1 is applied to the source line side at the variable resistor element of the selected memory cell (memory cell to be read) connected to the selected bit line and the selected source line. When the source line side is assumed as the reference potential, the dummy read voltage of −V1 is applied to the variable resistor element. The application of the dummy read voltage is maintained during the reproduction period Td. The voltage V1 is then applied to the selected bit line and the potential of the selected source line as well as the non-selected bit line is returned to the ground potential Vss. Consequently, the voltage V1 is applied to the bit line side, and Vss (=0V) is applied to the source line side at the variable resistor element of the selected memory cell (=memory cell to be read) connected to the selected bit line and the selected source line. When the source line side is assumed as the reference potential, the read voltage of voltage V1 is applied to the variable resistor element. The application of the read voltage is maintained during the read period Tr, and the electrical resistance, that is, the read current corresponding to the storage state flows to the variable resistor element of the selected memory cell via the selective transistor turned on through the selected bit line, thereby allowing the data stored in the selected memory cell to be read by the read circuit 13. After the read period Tr has elapsed, the potential of the selected word line and the selected bit line is returned to the ground potential Vss. In the present embodiment, the selected memory cell corresponds to the memory cell to be read.

According to the above processing procedures, as the application of the dummy read voltage −V1 and the application of the read voltage V1 are performed in pairs temporally one after the other during the period the power supply voltage Vcc is applied to the selected word line and the selective transistor of the selected memory cell is turned on, the resistance change of the variable resistor element involved in the read operation of the selected memory cell is suppressed.

The reproduction period Td may be the same as the read period Tr, but may also be shortened by having the voltage V1 applied to the selected source line and the non-selected bit line during the reproduction period Td to be a voltage higher than the voltage V1 applied to the selected bit line during the read period Tr.

Figure 25:
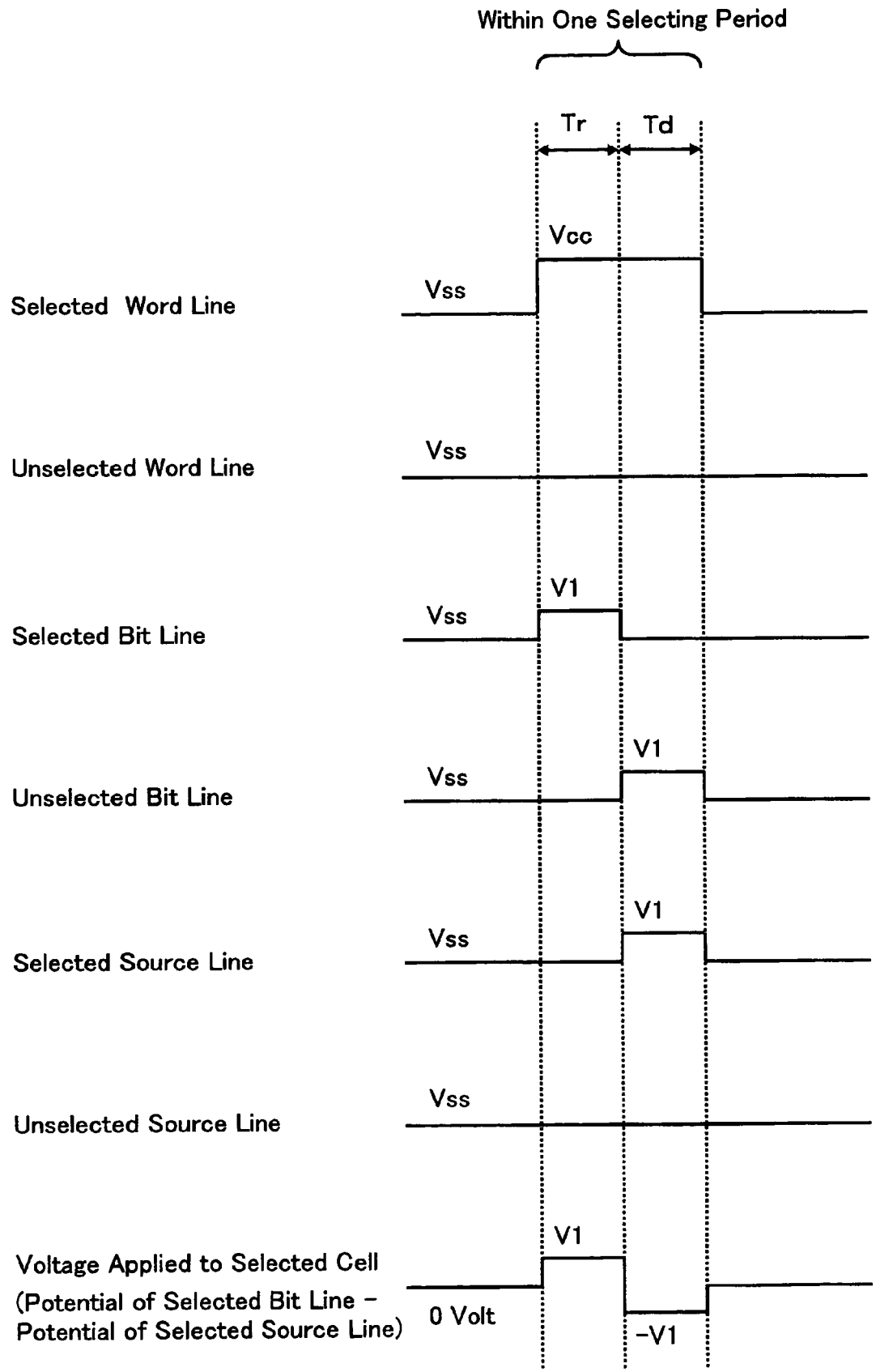
FIG. 25 is a timing diagram showing another example of a procedure for applying a voltage to each word line, each bit line and each source line in read operation of data in the memory cell configured with 1T/1R type memory cell of the nonvolatile semiconductor memory device according to the present invention.

A case of applying the dummy read voltage for suppressing the resistance change of the selected memory cell after applying the read voltage to the selected memory cell for read operation of the data will now be explained with reference to FIG. 25.

First, the potential of the selected word line connected to the selected memory cell is increased from the state in which all of the word lines, the bit lines, and the source lines are at the ground potential Vss to the power supply voltage Vcc to turn on the selective transistor of one row of memory cells connected to the selected word line. Simultaneously, the voltage V1 is applied to the selected bit line. Consequently, voltage V1 is applied to the bit line side and Vss (=0V) is applied to the source line side at the variable resistor element of the selected memory cell (=memory cell to be read) connected to the selected bit line and the selected source line. When the source line side is assumed as the reference potential, the read voltage of voltage V1 is applied to the variable resistor element. The application of the read voltage is maintained during the read period Tr, and the electrical resistance, that is, the read current corresponding to the storage state flows to the variable resistor element of the selected memory cell via the selective transistor turned on through the selected bit line, thereby allowing the data stored in the selected memory cell to be read by the read circuit 13. After the read period Tr has elapsed, the potential of the selected bit line is returned to the ground potential Vss, and the voltage V1 is applied to the selected source line and the non-selected bit line in the same row as the selected line. Since the potential of the selected bit line remains at the ground potential Vss, Vss (=0V) is applied to the bit line side and V1 is applied on the source line side at the variable resistor element of the selected memory cell (memory cell to be read) connected to the selected bit line and the selected source line. When the source line side is assumed as the reference potential, the dummy read voltage of −V1 is applied to the variable resistor element. The application of the dummy read voltage is maintained during the reproduction period Td, and after the reproduction period Td has elapsed, the potential of the selected word line, the selected source line and the non-selected bit line is returned to the ground potential Vss.

According to the above processing procedures, as the application of the read voltage V1 and the application of the dummy read voltage −V1 are performed in pairs temporally one after the other during the period power supply voltage Vcc is applied to the selected word line and the selective transistor of the selected memory cell is turned on, the resistance change of the variable resistor element involved in the read operation of the selected memory cell is suppressed.

The reproduction period Td may be the same as the read period Tr, but may also be shortened by having the voltage V1 applied to the selected source line and the non-selected bit line during the reproduction period Td to be a voltage higher than the voltage V1 applied to the selected bit line during the read period Tr.

Another embodiment of the present invention device will now be explained.

In each of the above embodiment, the memory cell array configuration for each case of having the memory cell structure as 1R type memory cell and as 1T/1R type memory cell has been explained by way of an example, but the memory cell structure may be any structure other than the 1R type memory cell and the 1T/1R type memory cell as long as the direction the current flows through the variable resistor element of the selected memory cell is positive-negative reversed. Further, the selective transistor of the 1T/1R type memory cell is not limited to the N-type MOSFET and may be a P-type MOSFET.

Figure 2:
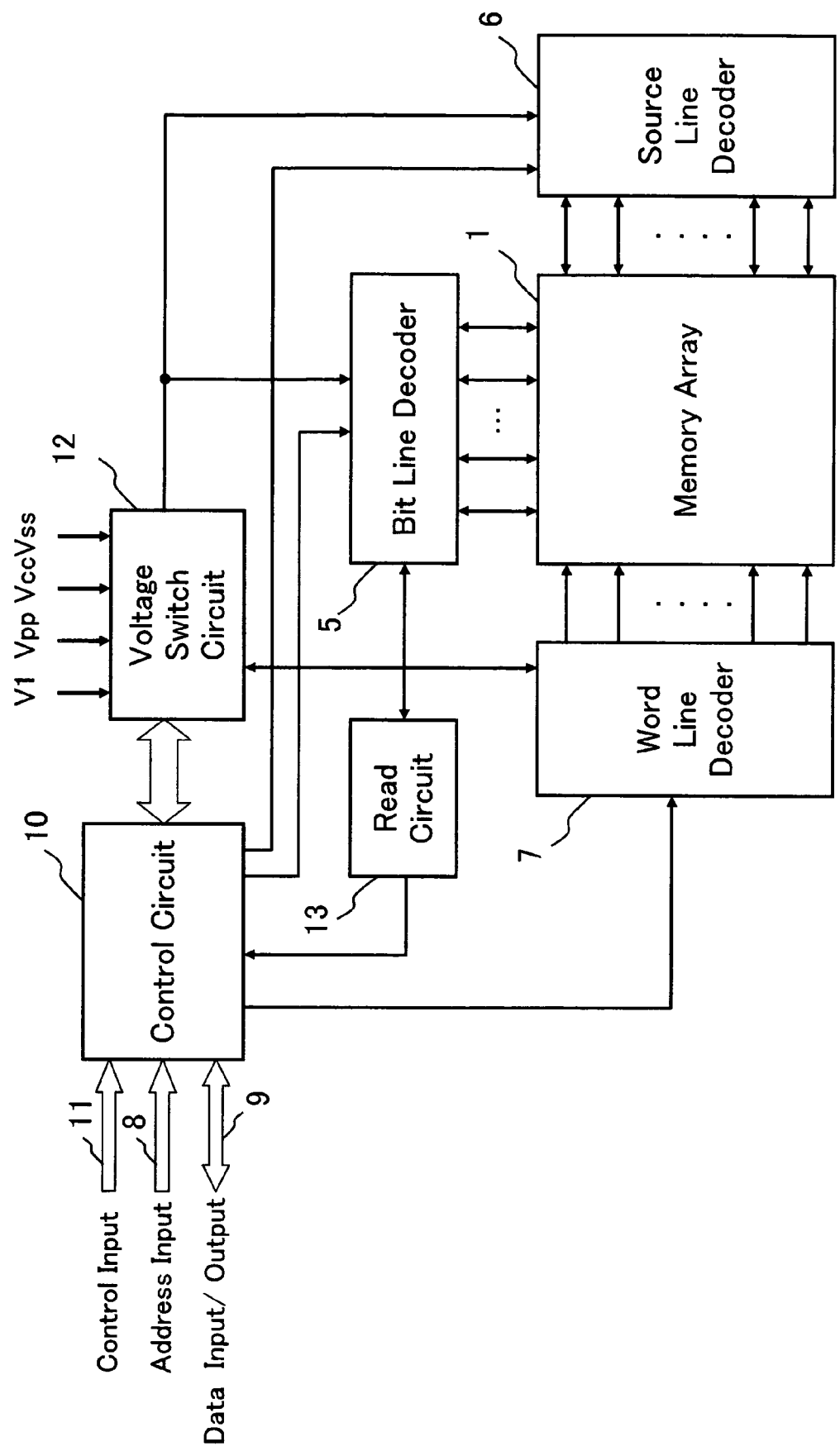
FIG. 2 is a block diagram showing one configuration example of a conventional nonvolatile semiconductor memory device including the memory cell array of 1T/1R type memory cell.

In the above third embodiment, a configuration in which the source line extending in the row direction is arranged in each row as shown in FIG. 2 is given by way of an example for the memory cell array configuration of the 1T/1R type memory cell, but the memory cell array configuration of the 1T/1R type memory cell is not limited to the configuration of the above embodiment. For instance, the source line may be extended parallel to the bit line in the column direction. In such case, a voltage application method different from the voltage application procedure explained in FIG. 24 and FIG. 25 is adopted, and for example, the potential of the non-selected bit line is maintained at the same potential (e.g., ground potential Vss) as the non-selected source line. Further, the source line may be shared in memory cell array units.

In the first and the second embodiments, a case of performing read operation by selecting one word line and selecting the read current flowing through the selected memory cell connected to the relevant selected word line on the bit line side is assumed, but the relationship between the word line and the bit line may be inverted, and a method of performing read operation by selecting one bit line and selecting the read current flowing through the selected memory cell connected to the relevant selected bit line on the word line side may be adopted. In this case, the read circuit 23 is connected on the word line decoder 17 side.

In the third embodiment, a case in which the read current flowing through the selected memory cell during the read period Tr flows from the bit line side towards the source line side is assumed, but may be changed to a case in which the read current flowing through the selected memory cell during the read period Tr flows from the source line side towards the bit line side. The voltage setting to be applied to each bit line and each source line may be changed with the current flowing through the selected memory cell during the reproduction period Td flowing from the bit line side towards the source line side. In this case, the read circuit 13 may be connected to the source line decoder 6 side, as necessary.

In each of the above embodiment, a case in which the voltage pulse of a constant voltage amplitude is applied to each word line, each bit line, and each source line (only third embodiment) is explained, but the voltage amplitude of the voltage pulse to be applied is not necessarily controlled to be constant. For instance, the pulse control may be performed through current control instead of voltage control.

In each of the above embodiment, the voltage switch circuit 22a, 22b, 22c, 22d, or 12a shown in FIG. 8, FIG. 13, FIG. 16, FIG. 19 or FIG. 23 is shown so that the voltage of each operation of write, erase, and read is generated in one circuit block, but a circuit that generates the voltage for each operation individually may be arranged. Further, the read voltage application circuit in read operation may be arranged in each decoder.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A nonvolatile semiconductor memory device comprising:
    a memory cell array formed by arraying a plurality of memory cells each including a variable resistor element for storing information through change in electrical resistance in a row direction and a column direction;
    a memory cell selecting circuit for selecting one of the memory cells from the memory cell array in units of row, column or memory cell;
    a read voltage application circuit for applying a read voltage to the variable resistor element of the selected memory cells selected by the memory cell selecting circuit; and
    a read circuit for detecting an amount of the read current flowing in accordance with a resistance value of the variable resistor element with respect to the memory cell to be read out of the selected memory cells and reading information stored in the memory cell to be read; wherein
    the read voltage application circuit applies a dummy read voltage having reversed polarity from the read voltage to the variable resistor element of the selected memory cell.

2. The nonvolatile semiconductor memory device as claimed in claim 1, wherein the read voltage application circuit applies both the read voltage and the dummy read voltage to a same selected memory cell within one selecting period until the memory cell selecting circuit switches the selection of the selected memory cell to a different memory cell.

3. The nonvolatile semiconductor memory device as claimed in claim 1, wherein the read voltage application circuit applies the dummy read voltage after applying the read voltage to a same selected memory cell within one selecting period until the memory cell selecting circuit switches the selection of the selected memory cell to a different memory cell.

4. The nonvolatile semiconductor memory device as claimed in claim 1, wherein the read voltage application circuit applies the dummy read voltage before applying the read voltage to a same selected memory cell within one selecting period until the memory cell selecting circuit switches the selection of the selected memory cell to a different memory cell.

5. The nonvolatile semiconductor memory device as claimed in claim 1, wherein the variable resistor element is perovskite-type metal oxide.

6. The nonvolatile semiconductor memory device as claimed in claim 1, wherein the variable resistor element is a metal oxide in which a resistance value thereof reversibly changes by electrical pulse application.

7. The nonvolatile semiconductor memory device as claimed in claim 6, wherein a material of the variable resistor element is a transition metal oxide.

8. The nonvolatile semiconductor memory device as claimed in claim 6, wherein the metal oxide of the variable resistor element comprises Pr and Mn.

9. The nonvolatile semiconductor memory device as claimed in claim 1, wherein an application period of the dummy read voltage on the variable resistor element of the selected memory cell is shorter than an application period of the read voltage; and
   a current flowing through the variable resistor element of the selected memory cell during the application of the dummy read voltage is larger than a current flowing during the application of the read voltage.

10. The nonvolatile semiconductor memory device as claimed in claim 1, wherein
   the memory cell array includes a plurality of row selecting lines extending in the row direction and a plurality of column selecting lines extending in the column direction, each memory cell of a same row having one end side of the variable resistor element connected to a same row selecting line, and each memory cell of a same column having another other end side of the variable resistor element connected to a same column electing line; and
   the memory cell selecting circuit selects one column of or one row of memory cells from the memory cell array.

11. The nonvolatile semiconductor memory device as claimed in claim 10, wherein
   the read voltage application circuit applies a first voltage to one column selecting line or row selecting line corresponding to one column or one row selected by the memory cell selecting circuit, and applies a second voltage to the column selecting line and the row selecting line corresponding to the columns and rows other than the one column or the one row selected by the memory cell selecting circuit to apply the read voltage to the variable resistor element of the column of or one row of selected memory cells selected by the memory cell selecting circuit;
   the read voltage application circuit applies a third voltage to one column selecting line or row selecting line corresponding to one column or one row selected by the memory cell selecting circuit, and applies the second voltage to the column selecting line and the row selecting line corresponding to the columns and rows other than the one column or the one row selected by the memory cell selecting circuit to apply the dummy read voltage to the variable resistor element of one column of or one row of selected memory cells selected by the memory cell selecting circuit; and
   the second voltage has a voltage value of between the first voltage and the third voltage, and an absolute value of a voltage difference between the first voltage and the second voltage is the same as an absolute value of a voltage difference between the third voltage and the second voltage.

12. The nonvolatile semiconductor memory device as claimed in claim 10, wherein
   the read voltage application circuit applies a first voltage to one column selecting line or row selecting line corresponding to one column or one row selected by the memory cell selecting circuit, and applies a second voltage to the column selecting line and the row selecting line corresponding to the columns and rows other than the one column or the one row selected by the memory cell selecting circuit to apply the read voltage to the variable resistor element of the column of or one row of selected memory cells selected by the memory cell selecting circuit;
   the read voltage application circuit applies a third voltage to one column selecting line or row selecting line corresponding to one column or one row selected by the memory cell selecting circuit, and applies the second voltage to the column selecting line and the row selecting line corresponding to the columns and rows other than the one column or the one row selected by the memory cell selecting circuit to apply the dummy read voltage to the variable resistor element of one column of or one row of selected memory cells selected by the memory cell selecting circuit; and
   the second voltage has a voltage value of between the first voltage and the third voltage, an absolute value of a voltage difference between the first voltage and the second voltage is smaller than an absolute value of a voltage difference between the third voltage and the second voltage, and the application period of the read voltage is longer than the application period of the dummy read voltage.

13. The nonvolatile semiconductor memory device as claimed in claim 10, wherein
   the read voltage application circuit applies a first voltage to one column selecting line or row selecting line corresponding to one column or one row selected by the memory cell selecting circuit, and applies a second voltage to the column selecting line and the row selecting line corresponding to the columns and rows other than the one column or the one row selected by the memory cell selecting circuit to apply the read voltage to the variable resistor element of the column of or one row of selected memory cells selected by the memory cell selecting circuit; and
   the read voltage application circuit applies the second voltage to one column selecting line or row selecting line corresponding to one column or one row selected by the memory cell selecting circuit, and applies the first voltage to the column selecting line and the row selecting line corresponding to the columns and rows other than the one column or the one row selected by the memory cell selecting circuit to apply the dummy read voltage to the variable resistor element of one column of or one row of selected memory cells selected by the memory cell selecting circuit.

14. The nonvolatile semiconductor memory device as claimed in claim 10, wherein
the read voltage application circuit applies a first voltage to one column selecting line or row selecting line corresponding to one column or one row selected by the memory cell selecting circuit, and applies a second voltage to the column selecting line and the row selecting line corresponding to the columns and rows other than the one column or the one row selected by the memory cell selecting circuit to apply the read voltage to the variable resistor element of the column of or one row of selected memory cells selected by the memory cell selecting circuit;
the read voltage application circuit applies a fourth voltage having the same polarity as the second voltage to one column selecting line or row selecting line corresponding to one column or one row selected by the memory cell selecting circuit, and applies the first voltage to the column selecting line and the row selecting line corresponding to the columns and rows other than the one column or the one row selected by the memory cell selecting circuit to apply the dummy read voltage to the variable resistor element of one column of or one row of selected memory cells selected by the memory cell selecting circuit; and
an absolute value of a voltage difference between the first voltage and the fourth voltage is greater than an absolute value of a voltage difference between the first voltage and the second voltage, and the application period of the read voltage is longer than the application period of the dummy read voltage.

15. The nonvolatile semiconductor memory device as claimed in claim 10, wherein an application period of the read voltage and an application period of the dummy read voltage are provided in one selecting period until the memory cell selecting circuit switches the selection of the selected memory cell to a different memory cell, and a pre-charge period in which all the column selecting lines and all the row selecting lines have a same potential is provided between the application of the read voltage and the application period of the dummy read voltage.

16. The nonvolatile semiconductor memory device as claimed in claim 10, wherein
within one selecting period until the memory cell selecting circuit switches the selection of the selected memory cell to a different memory cell, the read voltage application circuit, from a state in which a second voltage is applied to all the column selecting lines and all the row selecting lines, applies a first voltage to one column selecting line or row selecting line corresponding to one column or one row selected by the memory cell selecting circuit, and after a first delay time has elapsed, applies the first voltage to the column selecting lines and the row selecting lines corresponding to the columns and the rows other than the one column or the one row selected by the memory cell selecting circuit, and after a pre-charge period has elapsed in which the first voltage is applied to all the column selecting lines and all the row selecting lines, applies the second voltage to one column selecting line or row selecting line corresponding to one column or one row selected by the memory cell selecting circuit, and after a second delay time has elapsed, applies the second voltage to the column selecting lines and the row selecting lines corresponding to the columns and rows other than the one column or the one row selected by the memory cell selecting circuit; and
one of the elapsed period of the first delay time or the second delay time is an application period of the read voltage, and another is an application period of the dummy read voltage.

17. The nonvolatile semiconductor memory device as claimed in claim 15, wherein one of either a first pulse for defining a total period of an application period of the read voltage and a pre-charge period and a second pulse for defining a total period of an application period of the dummy read voltage and a pre-charge period is generated by time delay of the other pulse.

18. The nonvolatile semiconductor memory device as claimed in claim 16, wherein one of either a first pulse for defining a total period of the application period of the read voltage and the pre-charge period and a second pulse for defining a total period of the application period of the dummy read voltage and the pre-charge period is generated by time delay of the other of the either first or second pulse.

19. The nonvolatile semiconductor memory device as claimed in claim 1, wherein
the memory cell is configured including a series circuit of the variable resistor element and a selective transistor;
the memory cell array includes a plurality of row selecting lines extending in the row direction and a plurality of column selecting lines extending in the column direction, each memory cell of a same row having a gate of the selective transistor connected to a same row selecting line, each memory cell of a same column having one end of the series circuit connected to a same column selecting line, and each memory cell having another end of the series circuit connected to a source line;
the memory cell selecting circuit selects at least one memory cell of a same row from the memory cell array; and
the read voltage application circuit applies a voltage conducting the selective transistor to the row selecting line connected to the selected memory cell selected by the memory cell selecting circuit and applies each of the read voltage and the dummy read voltage to between the column selecting line and the source line connected to the selected memory cell.

20. A method of reading information from a memory cell comprising a variable resistor element for storing information through change in electrical resistance, wherein the method comprises:
a first process of applying a predetermined read voltage to the variable resistor element of the memory cell to be read and determining an amount of the current flowing to the variable resistor element; and
a second process of applying a dummy read voltage having reversed polarity from the read voltage to the variable resistor element of the memory cell applied with the read voltage in the first process.

21. The method as claimed in claim 20, wherein the first process and the second process are performed temporally one after another during a period the memory cell applied with the read voltage in the first process is selected.

22. The method as claimed in claim 20, wherein the variable resistor element is perovskite-type metal oxide.

23. The method as claimed in claim 20, wherein the variable resistor element is a metal oxide in which the resistance value reversibly changes by an electrical pulse application.

24. The method as claimed in claim 23, wherein a material of the variable resistor element is a transition metal oxide.

25. The method as claimed in claim 23, wherein the metal oxide of the variable resistor element comprises Pr and Mn.

26. A read device of information on a memory cell comprising a variable resistor element for storing information through change in electrical resistance, wherein the device comprises:

a determination circuit for applying a predetermined read voltage to the variable resistor element of the memory cell to be read and determining an amount of the current flowing to the variable resistor element; and a dummy read voltage application circuit for applying a dummy read voltage having reversed polarity from the read voltage to the variable resistor element of the memory cell applied with the read voltage in the process performed by the determination circuit.

* * * * *